(12) United States Patent
Miura et al.

(10) Patent No.: US 12,342,513 B2
(45) Date of Patent: Jun. 24, 2025

(54) CASE AND ELECTRIC APPARATUS

(71) Applicant: DENSO CORPORATION, Kariya (JP)

(72) Inventors: Shinichi Miura, Kariya (JP); Kai Morimoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 279 days.

(21) Appl. No.: 18/193,146

(22) Filed: Mar. 30, 2023

(65) Prior Publication Data

US 2023/0247809 A1    Aug. 3, 2023

Related U.S. Application Data

(63) Continuation of application No. PCT/JP2021/036581, filed on Oct. 4, 2021.

(30) Foreign Application Priority Data

Nov. 19, 2020   (JP) .................................. 2020-192577

(51) Int. Cl.
| | | |
|---|---|---|
| H05K 7/20 | (2006.01) | |
| H02M 7/00 | (2006.01) | |
| H05K 5/02 | (2006.01) | |
| H02M 7/48 | (2007.01) | |

(52) U.S. Cl.
CPC ........ H05K 7/20927 (2013.01); H02M 7/003 (2013.01); H05K 5/02 (2013.01); H02M 7/48 (2013.01)

(58) Field of Classification Search
CPC ................................................ H05K 7/20927
See application file for complete search history.

(56) References Cited

U.S. PATENT DOCUMENTS 10,581,339 B2 *   3/2020   Yamaura ............... H02M 7/003
2013/0206371 A1   8/2013   Fujita
(Continued)

FOREIGN PATENT DOCUMENTS

| JP | 2003-101277 A | 4/2003 |
|---|---|---|
| JP | 2009-115448 A | 5/2009 |

(Continued)

OTHER PUBLICATIONS

Dec. 21, 2021 International Search Report issued in International Patent Application No. PCT/JP2021/036581.

*Primary Examiner* — Mukundbhai G Patel
(74) *Attorney, Agent, or Firm* — Oliff PLC

(57) ABSTRACT

An electric power converter apparatus includes a case. The case includes a case main body and a lower cover. A recess is formed at a main body floor of the case main body and is covered with the lower cover to form a floor passage. The floor passage includes an upstream passage and a downstream passage. The lower cover includes joint plate portions, a passage plate portion and beads. The joint plate portions are arranged side by side in a width direction of the floor passage while the floor passage is interposed between the joint plate portions. The passage plate portion extends over the joint plate portions in the width direction of the floor passage. Each bead is formed between the passage plate portion and a corresponding one of the joint plate portions and extends in an intersecting direction that intersects the passage plate portion.

8 Claims, 19 Drawing Sheets

(56) References Cited

U.S. PATENT DOCUMENTS

| | | | | |
|---|---|---|---|---|
| 2014/0009890 A1* | 1/2014 | Moon | .................. | H05K 9/0088 |
| | | | | 361/707 |
| 2014/0096938 A1* | 4/2014 | Kojima | ................ | H01L 23/473 |
| | | | | 165/104.19 |
| 2019/0150328 A1* | 5/2019 | Miura | .................... | B60R 16/03 |
| | | | | 361/699 |
| 2020/0253094 A1* | 8/2020 | Liu | .................... | H05K 7/20872 |

FOREIGN PATENT DOCUMENTS

| | | |
|---|---|---|
| JP | 2017-107502 A | 6/2017 |
| JP | 2019-125716 A | 7/2019 |

* cited by examiner

CASE AND ELECTRIC APPARATUS

CROSS REFERENCE TO RELATED APPLICATIONS

This application is a continuation application of International Patent Application No. PCT/JP2021/036581 filed on Oct. 4, 2021, which designated the U.S. and claims the benefit of priority from Japanese Patent Application No. 2020-192577 filed on Nov. 19, 2020. The entire disclosures of all of the above applications are incorporated herein by reference.

TECHNICAL FIELD

The present disclosure relates to a case and an electric apparatus.

BACKGROUND

There has been proposed a case that has a passage configured to conduct refrigerant. This case functions as a cooler that receives a reactor at an inside thereof. The case includes a main body and a cover. Among side surfaces of the cover, which form the passage, an upper surface of the case is opened, and the cover covers this opening of the passage. The cover is joined to the main body by friction stir welding. A joint between the cover and the main body formed by the friction stir welding extends along a periphery of the passage.

SUMMARY

This section provides a general summary of the disclosure, and is not a comprehensive disclosure of its full scope or all of its features.

According to the present disclosure, there is provided a case that has a passage which is configured to conduct fluid and extends along an inside space of the case. The case includes a case main body and a passage cover. The case main body has a main body surface and defines the inside space, and a recess, which forms the passage, is formed at the main body surface. The passage cover is shaped in a plate form and is assembled to the main body surface to cover the recess, and the passage cover cooperates with the recess to form the passage. The passage cover includes a pair of joint plate portions, a passage plate portion and a connection portion. The pair of joint plate portions are joined to the main body surface through a joint, and the pair of joint plate portions are arranged one after another in a width direction of the passage while the passage is interposed between the pair of joint plate portions. The passage plate portion is placed between the pair of joint plate portions and is opposed to the recess via the passage in a state where the passage plate portion extends in the width direction. The connection portion is placed between the passage plate portion and one of the pair of joint plate portions, and the connection portion is joined to the passage plate portion and extends in an intersecting direction that intersects the passage plate portion.

According to the present disclosure, there is also provided an electric apparatus that includes an electrical component and the case described above while the electrical component is received in the inside space of the case.

BRIEF DESCRIPTION OF DRAWINGS

The drawings described herein are for illustrative purposes only of selected embodiments and not all possible implementations, and are not intended to limit the scope of the present disclosure.

DETAILED DESCRIPTION

Figure 1:
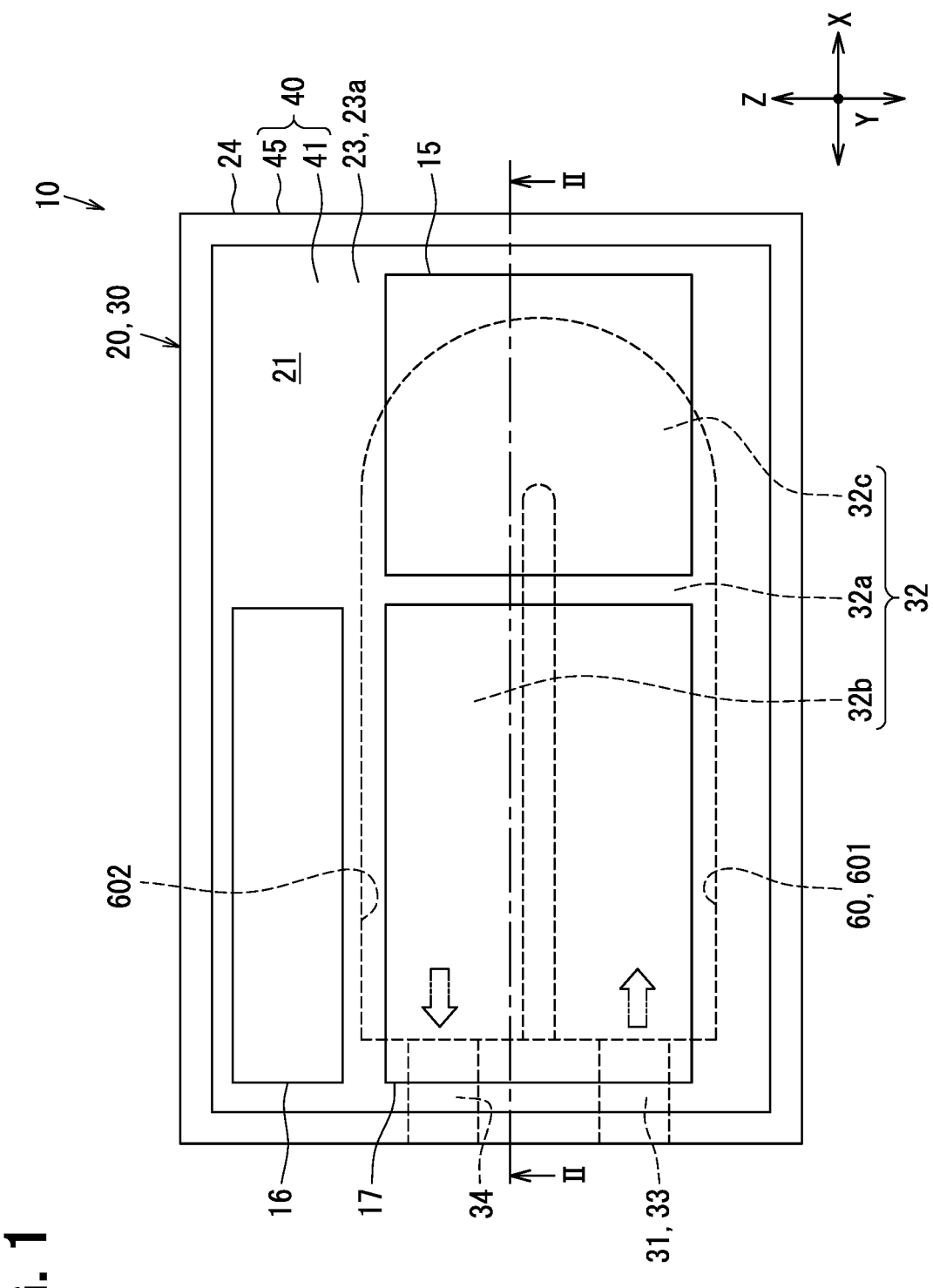
FIG. 1 is a plan view of an electric power converter apparatus of a first embodiment.

There has been proposed a case that has a passage configured to conduct refrigerant. This case functions as a cooler that receives a reactor at an inside thereof. The case includes a main body and a cover. Among side surfaces of the cover, which form the passage, an upper surface of the case is opened, and the cover covers this opening of the passage. The cover is joined to the main body by friction stir welding. A joint between the cover and the main body formed by the friction stir welding extends along a periphery of the passage.

However, in the case in which the passage is formed, an internal pressure, which is a pressure exerted from the refrigerant to the case, may increase. When the internal pressure exerted from the refrigerant is increased, a stress, which is generated due to this internal pressure, may be concentrated at a part of an inner peripheral end of the joint to cause plastic deformation of the cover. When the plastic deformation of the cover occurs, the refrigerant does not flow properly in the passage.

A plurality of aspects disclosed in this specification employ different technical measures to achieve the objective. In addition, a scope of claims and each reference sign in parentheses described in this section is an example of correspondence with the specific means described in embodiments as one aspect, and do not limit the technical scope.

According to one aspect of the present disclosure, there is provided a case that has a passage which is configured to conduct fluid and extends along an inside space of the case, the case including:

a case main body that has a main body surface and defines the inside space, wherein a recess, which forms the passage, is formed at the main body surface; and a passage cover that is shaped in a plate form and is assembled to the main body surface to cover the recess, wherein the passage cover cooperates with the recess to form the passage, wherein:

the passage cover includes:

a pair of joint plate portions which are joined to the main body surface through a joint, wherein the pair of joint plate portions are arranged one after another in a width direction of the passage while the passage is interposed between the pair of joint plate portions;

a passage plate portion which is placed between the pair of joint plate portions and is opposed to the recess via the passage in a state where the passage plate portion extends in the width direction; and a connection portion that is placed between the passage plate portion and one of the pair of joint plate portions, wherein the connection portion is joined to the passage plate portion and extends in an intersecting direction that intersects the passage plate portion.

In the case, the connection portion, which is placed between the passage plate portion and the one of the pair of joint plate portions and is joined to the passage plate portion, extends in the intersecting direction that intersects the passage plate portion. In this configuration, the connection portion is configured to contact an inner surface of the recess and is configured to resiliently deform, so that a stress, which is generated due to an internal pressure of the passage and/or linear expansion of the passage cover, is less likely to be concentrated at a part of the passage cover, such as an inner peripheral end of the joint. Therefore, it is possible to limit the plastic deformation of the passage cover caused by localized deformation of the lower cover. By limiting the plastic deformation of the passage cover, the passage, which conducts the refrigerant, can be kept in an appropriate state.

According to another aspect of the present disclosure, there is provided an electric apparatus including:

an electrical component; and a case that receives the electrical component in an inside space of the case and has a passage which is configured to conduct fluid and extends along the electrical component, wherein:

the case includes:

a case main body that has a main body surface and defines the inside space, wherein a recess, which forms the passage, is formed at the main body surface; and a passage cover that is shaped in a plate form and is assembled to the main body surface to cover the recess, wherein the passage cover cooperates with the recess to form the passage; and the passage cover includes:

a pair of joint plate portions which are joined to the main body surface through a joint, wherein the pair of joint plate portions are arranged one after another in a width direction of the passage while the passage is interposed between the pair of joint plate portions;

a passage plate portion which is placed between the pair of joint plate portions and is opposed to the recess via the passage in a state where the passage plate portion extends in the width direction; and a connection portion that is placed between the passage plate portion and one of the pair of joint plate portions, wherein the connection portion is joined to the passage plate portion and extends in an intersecting direction that intersects the passage plate portion.

According to the electric apparatus described above, the advantages, which are similar to those of the case described above can be achieved.

Hereinafter, embodiments for implementing the present disclosure will be described with reference to the drawings. In each of the following embodiments, the same reference signs may be assigned to portions that are the same as or equivalent to those described in the preceding embodiment(s), and the description thereof may be omitted. Furthermore, when only a portion of a structure is described in each embodiment, the description of the rest of the structure described in the preceding embodiment may be applied to the rest of the structure. In addition to the combinations of portions that are specifically shown to be combinable in the respective embodiments, it is also possible to partially combine the embodiments even if they are not specifically shown, provided that the combinations are not impeded.

First Embodiment

An electric power converter apparatus 10 shown in FIG. 1 is included in a drive system. The drive system is installed on a vehicle, such as an electric vehicle (EV), a hybrid vehicle (HV), and a fuel cell vehicle. The drive system includes an inverter device, a battery and an electric motor in addition to the electric power converter apparatus 10. The drive system is a system that drives drive wheels of the vehicle by driving the electric motor.

The battery is a direct current (DC) voltage source that is formed by a chargeable and dischargeable secondary battery. The secondary battery is, for example, a lithium-ion battery or a nickel-metal hydride battery. The drive system includes a high-voltage battery and a low-voltage battery as the battery. A voltage of the high-voltage battery is, for example, 100 V, and a voltage of the low-voltage battery is, for example, 12 V. The high-voltage battery may be referred to as a first electric power source, and the low-voltage battery may be referred to as a second electric power source.

The electric motor is a three-phase alternating current (AC) rotary electric machine. The three phases of the electric motor include a U-phase, a V-phase and a W-phase. The electric motor functions as a vehicle drive power source. The electric motor also functions as an electric power generator at the time of regeneration.

The inverter device executes electric power conversion between the high-voltage battery and the electric motor. The inverter device is capable of executing two-way electric power conversion. The inverter device converts the DC power from the high-voltage battery into the AC power and supplies the AC power to the electric motor. Furthermore, the inverter device converts the AC power generated by the electric motor into the DC power and supplies the DC power to the high-voltage battery. The inverter device includes an inverter circuit and a capacitor. The inverter circuit includes a plurality of semiconductor switches. The capacitor is, for example, a smoothing capacitor, which smooths the DC voltage to be supplied from the high-voltage battery to the inverter circuit.

The electric power converter apparatus 10 is a converter apparatus. The electric power converter apparatus 10 or a converter unit 15 described later may be referred to as a DC-DC converter. The electric power converter apparatus 10 is capable of executing two-way electric power conversion. The electric power converter apparatus 10 converts a DC voltage into another DC voltage. The electric power converter apparatus 10 converts the electric power between the high-voltage battery and the low-voltage battery. The electric power converter apparatus 10 reduces the DC voltage, which is outputted from the high-voltage battery, and supplies it to the low-voltage battery. The electric power converter apparatus 10 converts the electric power between the inverter device and the low-voltage battery. The electric power converter apparatus 10 reduces the DC voltage, which is outputted from the inverter device, and supplies it to the low-voltage battery.

The electric power converter apparatus 10 includes a converter circuit, a capacitor and a reactor. The converter circuit includes a plurality of semiconductor switches. The capacitor is, for example, a filter capacitor which removes a power source noise from the high-voltage battery. The reactor boosts the voltage outputted from the high-voltage battery by, for example, a switching operation of the semiconductor switches in the converter circuit. Furthermore, the electric power converter apparatus 10 includes a control device which controls the converter circuit. The control device is formed by, for example, an ECU. The term ECU stands for Electronic Control Unit. Here, it should be noted that the control device may be included in the inverter device or may be common to both the electric power converter apparatus 10 and the inverter device.

Next, a structure of the electric power converter apparatus 10 will be described with reference to FIGS. 1 and 2.

Figure 2:
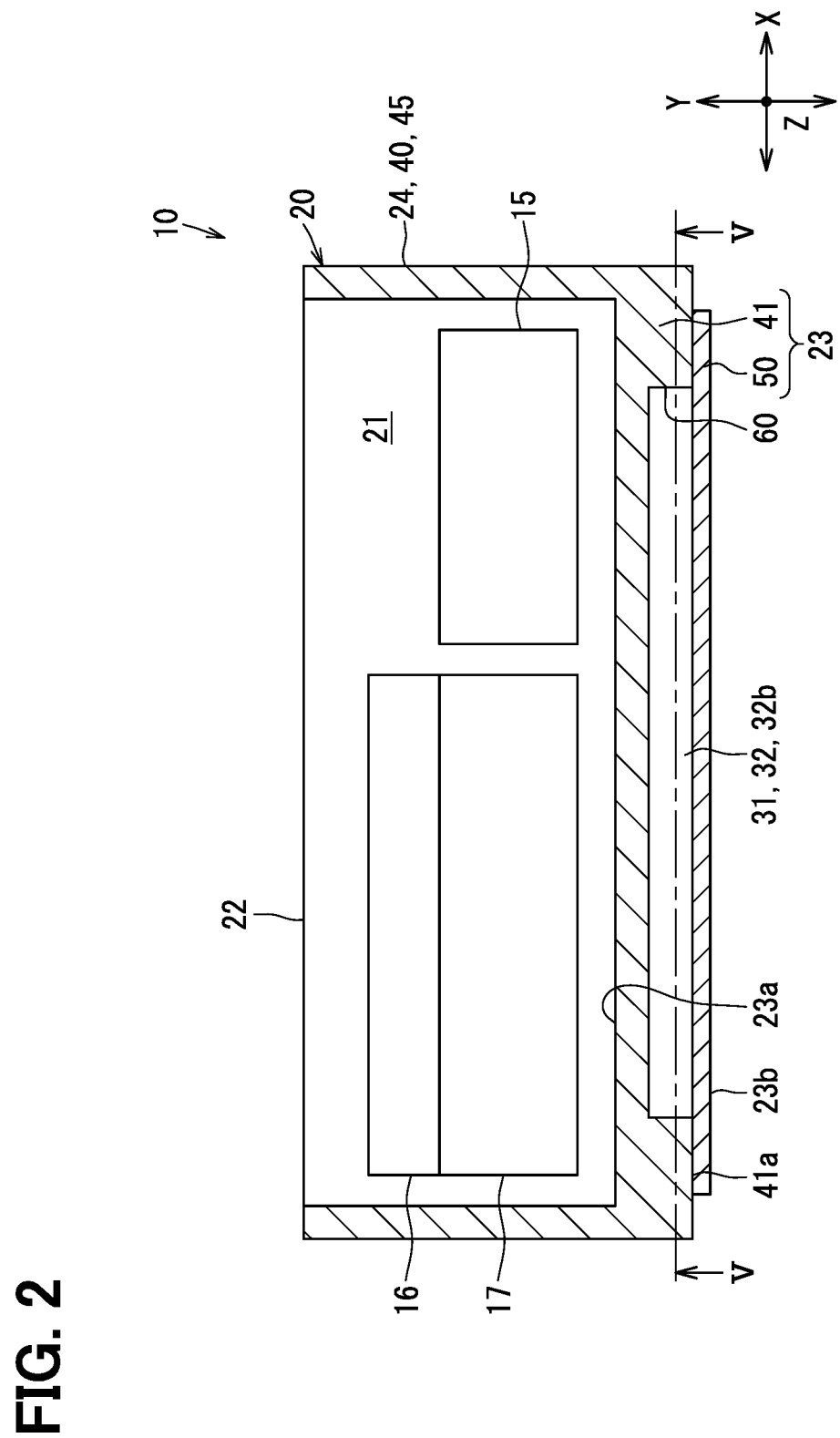
FIG. 2 is a cross-sectional view taken along line II-II in FIG. 1.

As shown in FIGS. 1 and 2, the electric power converter apparatus 10 includes the converter unit 15, a capacitor unit 16, a reactor unit 17 and a case 20. Each of the converter unit 15, the capacitor unit 16 and the reactor unit 17 serves as an electrical component, and the electric power converter apparatus 10 serves as an electric apparatus. The case 20 may be referred to as a converter case. FIG. 2 shows a side view of each of the converter unit 15 and the reactor unit 17 instead of a cross-sectional view thereof.

The converter unit 15, the capacitor unit 16 and the reactor unit 17 are respectively shaped in a rectangular cuboid form and are received in the case 20. The converter unit 15 includes: switching elements, which form the semiconductor switches of the converter circuit; and a switch case, which protects these switching elements. The capacitor unit 16 includes: a capacitor element, which forms the filter capacitor; and a capacitor case, which protects this capacitor element. The reactor unit 17 includes: a reactor element, which forms the reactor; and a reactor case, which protects the reactor element.

The case 20 is shaped in a rectangular tubular form as a whole. The case 20 includes an inside space 21, a case opening 22, a case floor 23 and a case outer wall 24. In the case 20, the case opening 22 is located on a side of the inside space 21 which is opposite to the case floor 23. The case outer wall 24 is shaped in a rectangular tubular form and forms the case opening 22.

In the present embodiment, three directions, which are perpendicular to each other, will be referred to as an X direction, a Y direction and a Z direction, respectively. In the case 20, the case opening 22 and the case floor 23 are arranged one after the other in the Y direction. The case floor 23 extends in the X direction and the Z direction which are perpendicular to the Y direction. Both the case 20 and the case floor 23 are flattened so as to become thin in the Y direction, and a thickness direction of the case 20 and the case floor 23 coincides with the Y direction.

The case floor 23 partitions between the inside and the outside of the case 20. A floor upper surface 23a of the case floor 23 is opposed to the case opening 22 via the inside space 21 and forms a floor surface of the inside space 21. A floor lower surface 23b of the case floor 23 faces a side, which is opposite to the case opening 22, and the floor lower surface 23b forms a lower surface of the case 20. The floor upper surface 23a and the floor lower surface 23b extend in a direction that is perpendicular to the Y direction. The case outer wall 24 extends in the Y direction and partitions between the inside and the outside of the case 20 like the case floor 23.

The converter unit 15, the capacitor unit 16 and the reactor unit 17 are all received in the inside space 21 of the case 20. The converter unit 15, the capacitor unit 16 and the reactor unit 17 are arranged side-by-side along the case floor 23. For example, the reactor unit 17 and the converter unit 15 are arranged side by side in the X direction, and the reactor unit 17 and the capacitor unit 16 are arranged side by side in the Z direction.

The electric power converter apparatus 10 includes a cooler 30. The cooler 30 uses refrigerant (thermal medium) to cool the inside space 21 of the case 20, the converter unit 15, the capacitor unit 16, and the reactor unit 17. The cooler 30 forms a refrigerant passage 31 which conducts the refrigerant and serves as a passage forming portion. The refrigerant is a fluid such as a liquid (e.g., water) or a gas (e.g., air). The refrigerant exerts a cooling effect by exchanging heat with the air, the converter unit 15, the capacitor unit 16 and the reactor unit 17 in the inside space 21 through the cooler 30. The cooler 30 includes the case 20 and a member, such as a pipe installed to the case 20. That is, the cooler 30 is formed by including the case 20.

The vehicle, to which the electric power converter apparatus 10 is installed, has a cooling system that includes the cooler 30. The refrigerant system includes: a circulation passage, through which the refrigerant is circulated; and a pump, which circulates the refrigerant in the circulation passage. The circulation passage includes the refrigerant passage 31. In the cooling system, when the pump is driven, the refrigerant flows in the refrigerant passage 31.

The refrigerant passage 31 includes a floor passage 32, an input passage 33 and an output passage 34. In the refrigerant passage 31, the input passage 33, the floor passage 32 and the output passage 34 are arranged in this order from the upstream side toward the downstream side, and this arranging direction will be referred to as an upstream-to-downstream direction. In the refrigerant passage 31, the input passage 33 and the output passage 34 may be directly connected to the floor passage 32 or may be indirectly connected to the floor passage 32 through, for example, a connection passage(s).

The floor passage 32 is formed by the case floor 23. The floor passage 32 is formed at an inside of the case floor 23 and extends along the floor lower surface 23b. The upstream-to-downstream direction of the floor passage 32 is a direction that is perpendicular to the Y direction. A width direction of the floor passage 32 is a direction that is perpendicular to both the Y direction and the upstream-to-downstream direction. A width direction of an upstream passage 32a and a width direction of a downstream passage 32b both coincide with the Z direction. The floor passage 32 serves as a passage which conducts the fluid.

The floor passage 32 is curved along the floor lower surface 23b. The floor passage 32 makes a U-turn to extend forward and then backward along the floor lower surface 23b and is thereby shaped in a U-form as a whole. The floor passage 32 includes the upstream passage 32a, the downstream passage 32b and a curved passage 32c. In the upstream-to-downstream direction of the floor passage 32, the curved passage 32c is located between the upstream passage 32a and the downstream passage 32b and connects between the upstream passage 32a and the downstream passage 32b. In the floor passage 32, the refrigerant flows from the upstream passage 32a to the downstream passage 32b through the curved passage 32c.

The upstream passage 32a, the curved passage 32c and the downstream passage 32b are arranged side-by-side along the floor lower surface 23b. The upstream passage 32a and the downstream passage 32b are arranged side by side in the Z direction. The upstream passage 32a and the downstream passage 32b are arranged next to the curved passage 32c in the X direction. The curved passage 32c overlaps with each of the upstream passage 32a and the downstream passage 32b in the Y direction. The curved passage 32c is curved such that the curved passage 32c bulges toward a side that is opposite to the upstream passage 32a and the downstream passage 32b in the X direction, so that the curved passage 32c is shaped in a curved form as a whole. A flow direction of the refrigerant in the upstream passage 32a and a flow direction of the refrigerant in the downstream passage 32b are opposite to each other in the X direction.

The floor passage 32 extends along the converter unit 15, the capacitor unit 16 and the reactor unit 17. The floor passage 32 is located next to the converter unit 15 and the reactor unit 17 in the Y direction. The reactor unit 17 is positioned across the upstream passage 32a and the downstream passage 32b. The converter unit 15 is positioned across the upstream passage 32a, the downstream passage 32b and the curved passage 32c.

Figure 3:
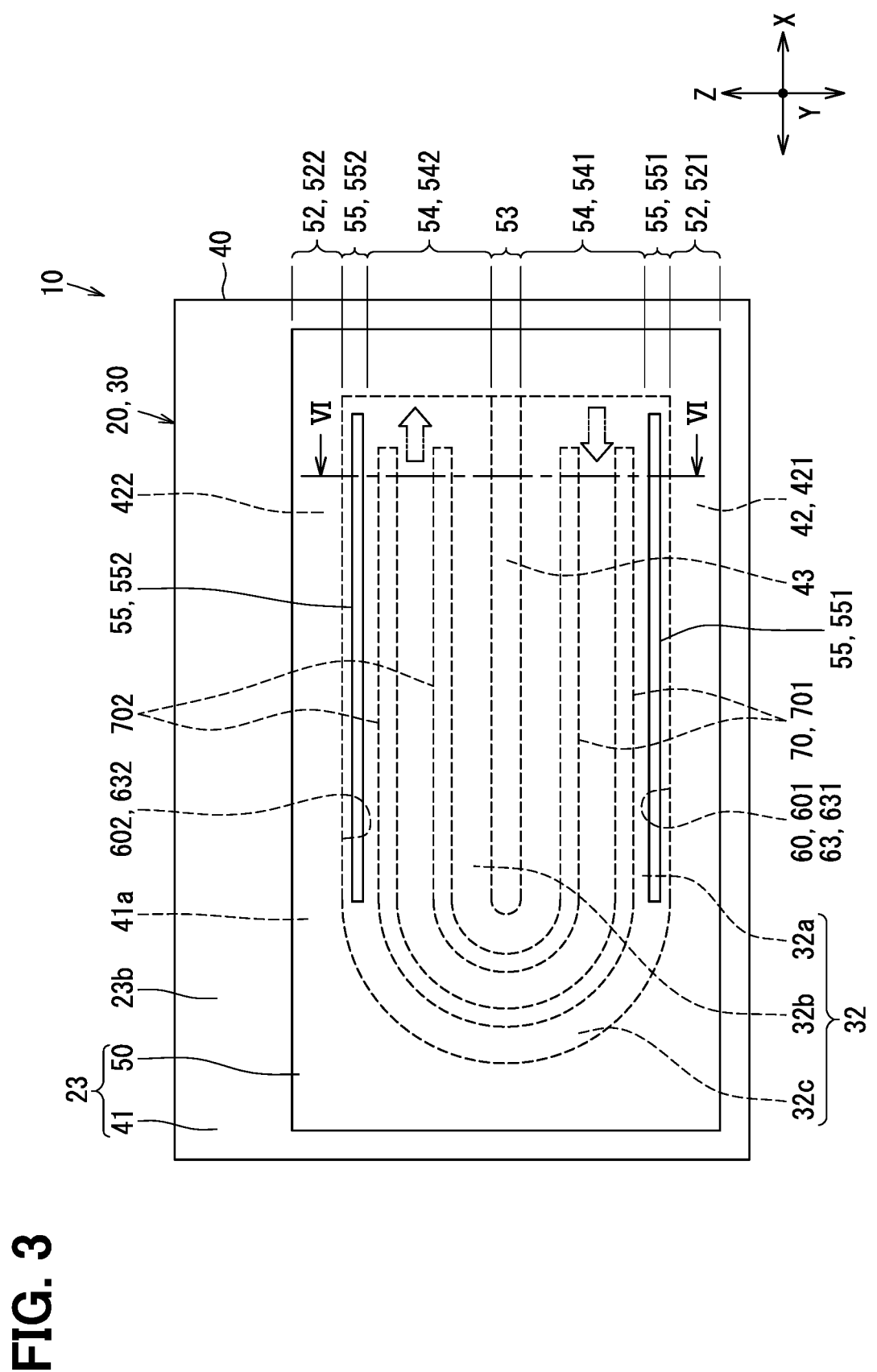
FIG. 3 is a bottom view of the electric power converter apparatus.

As shown in FIGS. 2 and 3, the case 20 includes a case main body 40 and a lower cover 50. The case main body 40 and the lower cover 50 are made of a metal material, such as aluminum. Each of the case main body 40 and the lower cover 50 is formed as a molded body that is formed integrally in one-piece by, for example, aluminum die-casting. The case main body 40 and the lower cover 50 have thermal conductivity.

The case main body 40 forms a major portion of the case 20 and defines the inside space 21. In the present embodiment, an inner surface of the case main body 40 forms an inner surface of the case 20 and defines the inside space 21. The case main body 40 includes a main body floor 41 and a main body outer wall 45. The main body floor 41 is a portion of the case main body 40 which is included in the case floor 23. An upper surface of the main body floor 41 forms the floor upper surface 23a of the case 20. When a lower surface of the main body floor 41 is referred as a main body lower surface 41a, this main body lower surface 41a forms the floor lower surface 23b of the case 20. The main body outer wall 45 is a portion of the case main body 40 which is included in the case outer wall 24. The main body lower surface 41a serves as a main body surface.

The case floor 23 is formed by the main body floor 41 and the lower cover 50. The lower cover 50 is included in the case floor 23 along with the main body floor 41. The lower cover 50 is shaped in a plate form as a whole and is assembled to the main body floor 41. The lower cover 50 overlaps with the main body lower surface 41a. The lower cover 50 extends in the directions which are perpendicular to the Y direction. The directions, which are perpendicular to the Y direction, are extending directions of the lower cover 50. An outer peripheral edge of the lower cover 50 is spaced from an outer peripheral edge of the main body lower surface 41a toward an inner peripheral side. Therefore, both the main body floor 41 and the lower cover 50 form the floor lower surface 23b of the case 20.

The floor passage 32 is located between the main body floor 41 and the lower cover 50 in the case floor 23. A recess 60 is formed at the main body lower surface 41a of the main body floor 41. An opening of the recess 60 is covered by the lower cover 50 to form the floor passage 32. The recess 60 forms the floor passage 32 and extends in a form of a groove in the upstream-to-downstream direction of the floor passage 32. The recess 60 opens toward the side which is opposite to the floor upper surface 23a. The recess 60 is recessed from the main body lower surface 41a toward the floor upper surface 23a. A depth direction and a height direction of each of the recess 60 and the floor passage 32 coincide with the Y direction.

The lower cover 50 covers the opening of the recess 60 from the side that is opposite to the floor upper surface 23a. In each of the extending directions of the floor lower surface 23b, the lower cover 50 extends outward beyond the recess 60. The lower cover 50 includes: an opposing portion, which is opposed to the recess 60; and an overlapping portion, which overlaps with the main body lower surface 41a. The overlapping portion of the lower cover 50, which overlaps with the main body lower surface 41a, is joined to the main body lower surface 41a. The lower cover 50 serves as a passage cover. A thickness direction of the lower cover 50 coincides with the Y direction.

Figure 5:
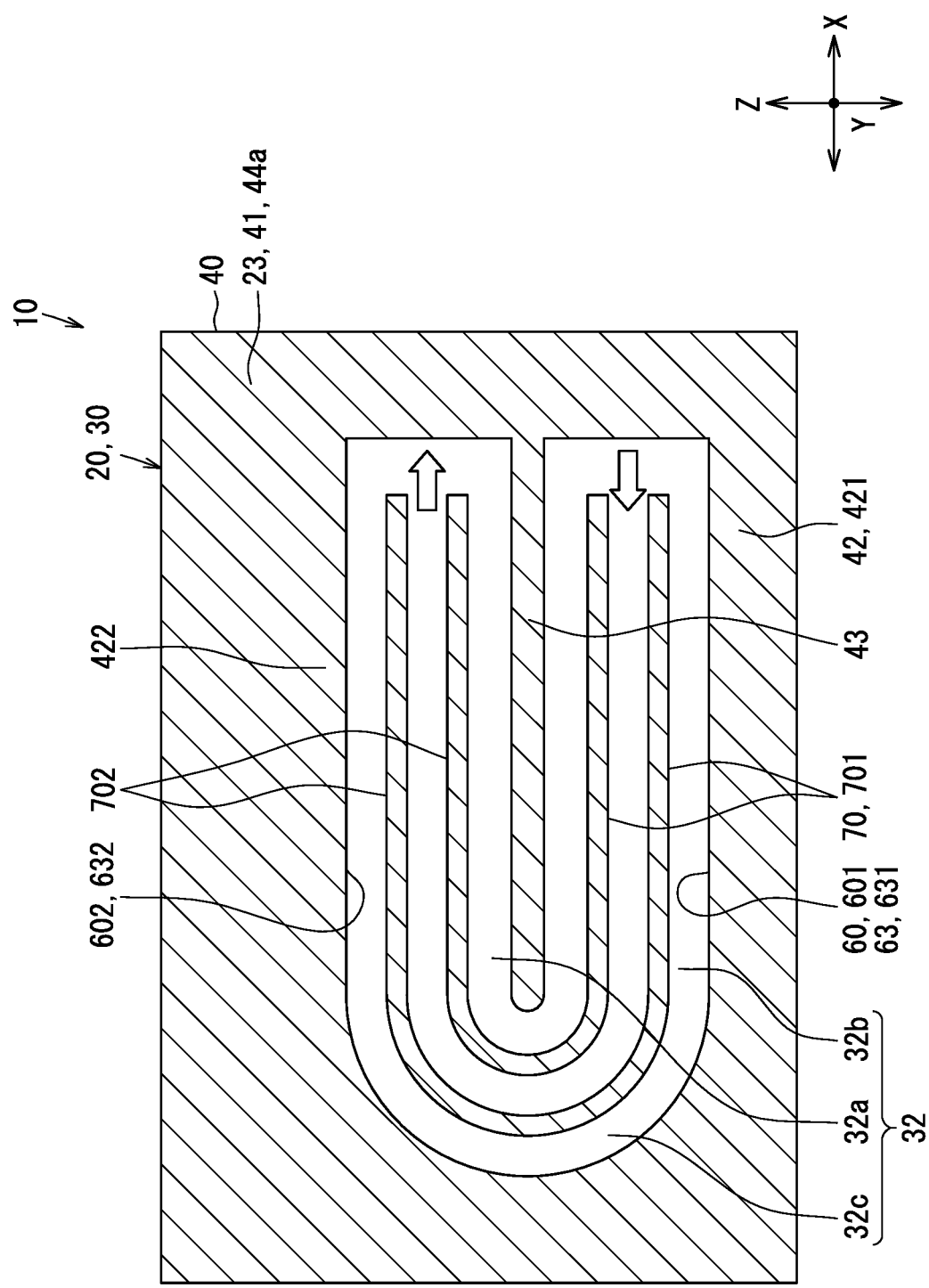
FIG. 5 is a cross-sectional view taken along line V-V in FIG. 2.
Figure 6:
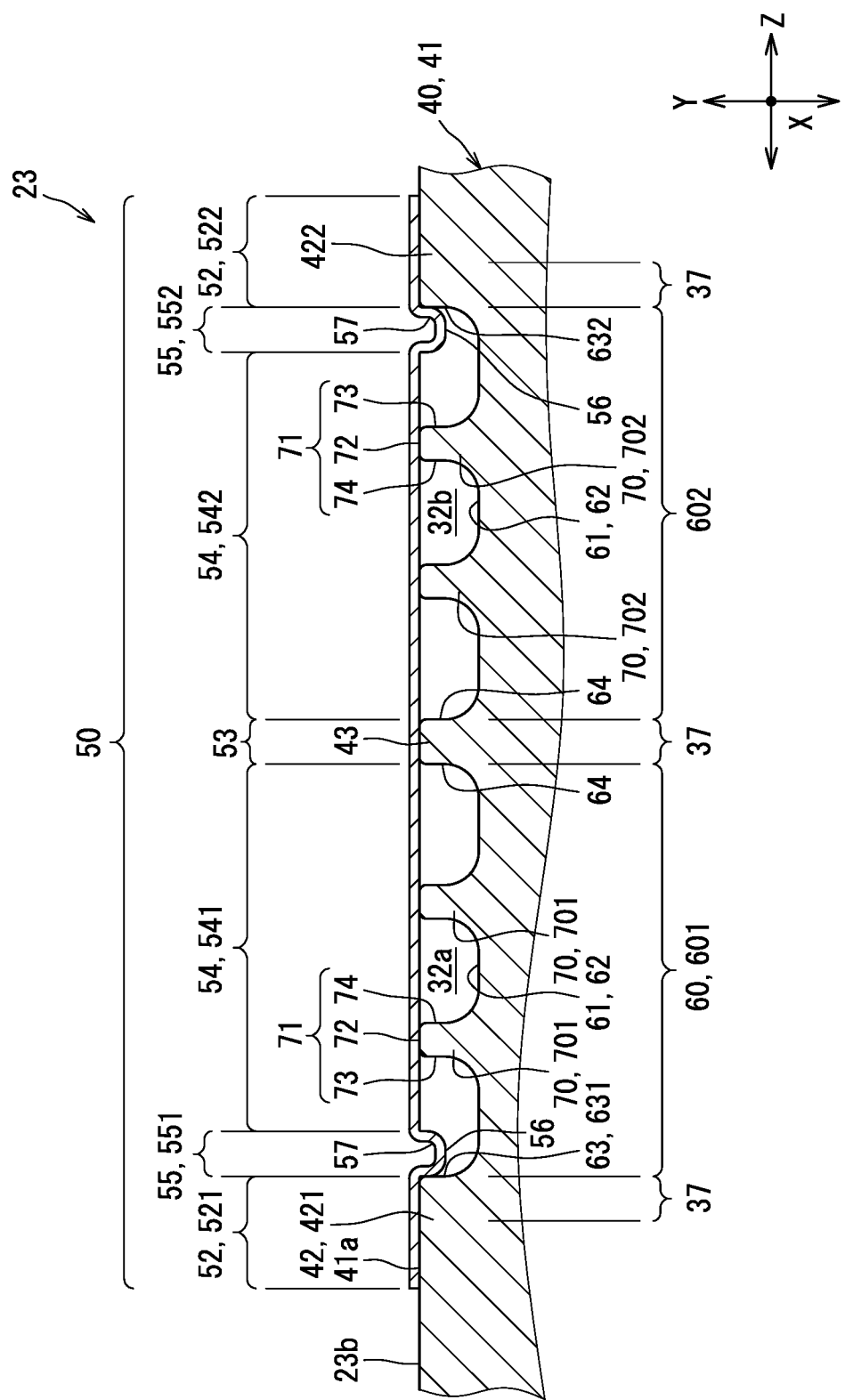
FIG. 6 is a vertical cross-sectional view of a floor passage taken along line VI-VI in FIG. 3.

As shown in FIGS. 3, 5 and 6. a plurality of fins 70 are formed at the floor passage 32. The fins 70 extend from a recess inner surface 61 of the recess 60 toward the lower cover 50. The recess inner surface 61 is an inner surface of the recess 60. The fins 70 extend in the upstream-to-downstream direction of the floor passage 32. The fins 70 are part of the main body floor 41. The fins 70 are arranged one after another in the width direction of the floor passage 32. The fins 70 are parallel to each other. Each of the fins 70 extends continuously along the upstream passage 32a and the downstream passage 32b through the curved passage 32c. By forming the fins 70 at the floor passage 32, a surface area of the recess inner surface 61 is increased.

A fin outer surface 71, which is an outer surface of the fin 70, has a fin distal end surface 72 and fin lateral surfaces 73, 74. The fin distal end surface 72 is opposed to the lower cover 50. The fin lateral surfaces 73, 74 are arranged one after the other in the width direction of the floor passage 32 while the fin distal end surface 72 is interposed between the fin lateral surfaces 73, 74. The fin lateral surfaces 73, 74 respectively extend in an intersecting direction which intersects the lower cover 50. The fin lateral surfaces 73, 74 extend from a recess bottom surface 62 of the recess 60 toward the lower cover 50. The fin lateral surfaces 73, 74 are connected with each other through the fin distal end surface 72.

A height dimension of each fin 70 is the same as the depth dimension of the recess 60. The fin distal end surfaces 72 of the fins 70 are arranged one after another on a plane of the main body lower surface 41a along the lower cover 50 and are thereby placed at the same height as the height of the main body lower surface 41a.

The recess inner surface 61 of the recess 60 includes the recess bottom surface 62 and recess wall surfaces 63, 64. The recess bottom surface 62 and the recess wall surfaces 63, 64 extend in the upstream-to-downstream direction of the floor passage 32 along the lower cover 50. The recess bottom surface 62 is opposed to the lower cover 50 via the floor passage 32. The recess wall surfaces 63, 64 are opposed to each other via the recess bottom surface 62. The recess wall surfaces 63, 64 are arranged one after the other in the width direction of the floor passage 32. The recess wall surfaces 63, 64 respectively extend in the intersecting direction which intersects the lower cover 50. The recess wall surfaces 63, 64 extend in the depth direction of the recess 60. The recess wall surfaces 63, 64 extend from the recess bottom surface 62 toward the lower cover 50. The recess wall surfaces 63, 64 form a peripheral edge portion of the floor passage 32.

The main body floor 41 includes floor wall portions 42, 43. The floor wall portions 42, 43 form the recess wall surfaces 63, 64, respectively, of the main body floor 41. In the main body floor 41, the floor wall portions 42, 43 are located on one side and the other side of the recess 60 along the lower cover 50. Among the floor wall portions 42, 43, the floor wall portion 42 forms the recess wall surface 63, and the floor wall portion 43 forms the recess wall surface 64. The floor wall portions 42, 43 form the main body lower surface 41a.

The fin outer surfaces 71 of the fins 70 are included in the recess inner surface 61 along with the recess bottom surface 62 and the recess wall surfaces 63, 64. The fins 70 extend from the recess bottom surface 62 toward the lower cover 50. The fin distal end surface 72 is placed closer to the lower cover 50 than the recess bottom surface 62.

The fins 70 partition the floor passage 32 in the width direction of the floor passage 32. The fin distal end surfaces 72 of the fins 70 are arranged one after the other on the plane of the main body lower surface 41a along the lower cover 50 and are thereby placed at the same height as the height of the main body lower surface 41a. The lower cover 50 overlaps with both the main body lower surface 41a and the fin distal end surfaces 72.

Figure 4:
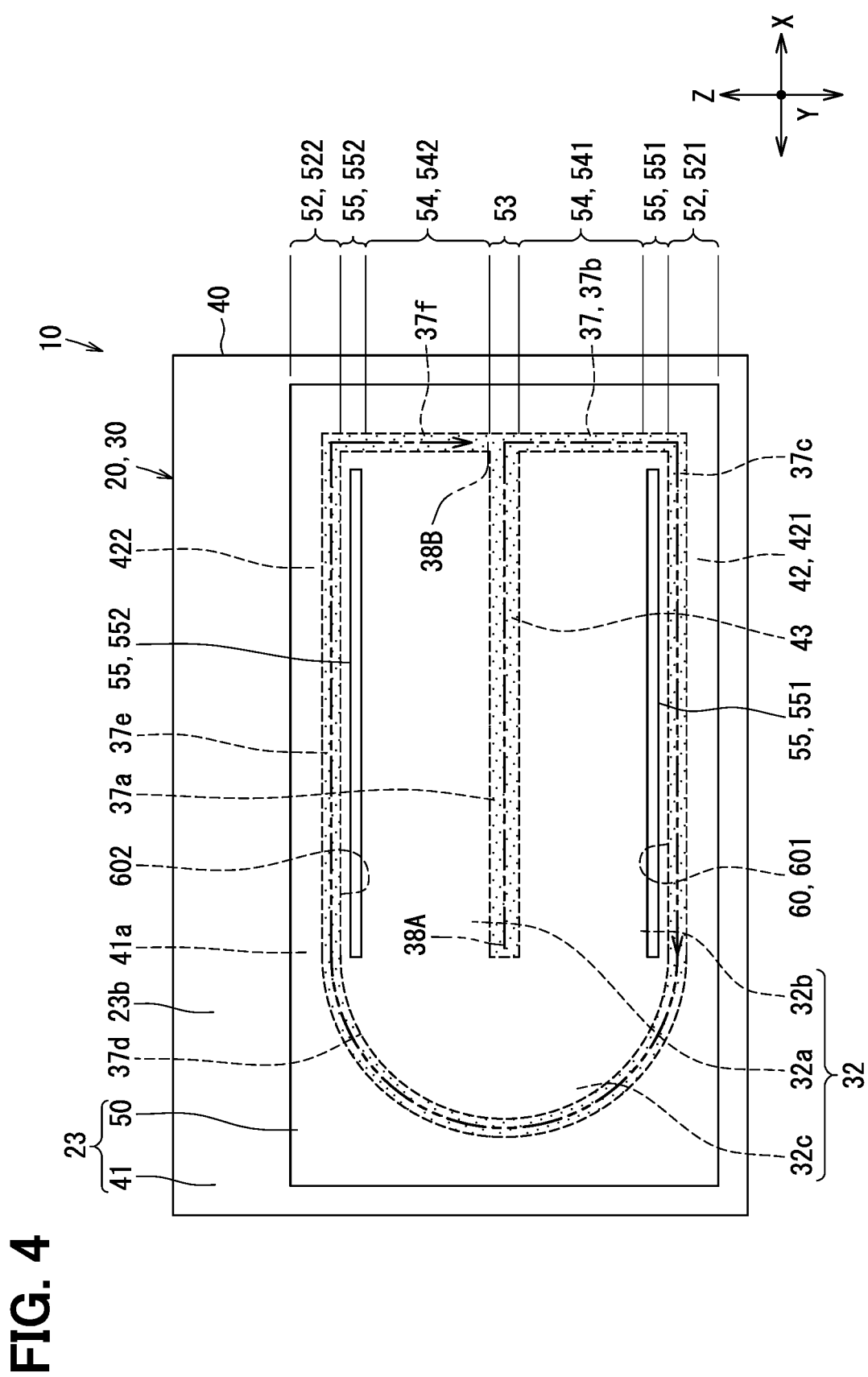
FIG. 4 is a diagram for explaining a joint of the electric power converter apparatus.

As shown in FIG. 4, the case floor 23 has a joint 37. The joint 37 is a portion where the main body floor 41 and the lower cover 50 are joined together. The lower cover 50 is fixed to the main body floor 41 by the joint 37. The joint 37 extends along the peripheral edge portion of the floor passage 32. In FIG. 4, the joint 37 is indicated by a dot hatching. Furthermore, the fins 70 are omitted in FIG. 4 for the sake of simplicity.

The joint 37 includes first to sixth joint portions 37a-37f. The first joint portion 37a is located between the upstream passage 32a and the downstream passage 32b and extends in the X direction along an inner peripheral edge of the peripheral edge portion of the floor passage 32. The second to sixth joint portions 37b-37f extend along an outer peripheral edge of the peripheral edge portion of the floor passage 32. The second joint portion 37b extends in the Z direction along an upstream end portion of the upstream passage 32a. The third joint portion 37c extends in the X direction along the upstream passage 32a. The fourth joint portion 37d is curved such that the fourth joint portion 37d extends along an outer peripheral edge of the curved passage 32c. The fifth joint portion 37e extends in the X direction along the downstream passage 32b. The sixth joint portion 37f extends in the Z direction along a downstream end portion of the downstream passage 32b.

As shown in FIGS. 3, 4 and 6, the lower cover 50 includes a plurality of joint plate portions 52, 53, a passage plate portion 54 and a plurality of beads 55. The joint plate portions 52, 53, the passage plate portion 54 and the beads 55 are arranged one after another along the main body floor 41. The joint plate portions 52, 53 are joined to the main body lower surface 41a by the joint 37. The joint plate portions 52, 53 overlap with the main body lower surface 41a and extends along the main body lower surface 41a. The joint plate portions 52, 53 extend along the peripheral edge portion of the floor passage 32. An inner peripheral end of each of the joint plate portions 52, 53 extends along an inner peripheral end of the joint 37. The joint plate portions 52, 53 are spaced from each other in the width direction of the floor passage 32. The joint plate portions 52, 53 are arranged side by side in the width direction of the floor passage 32 while the floor passage 32 is interposed between the joint plate portion 53 and the joint plate portion 52, and the joint plate portions 52, 53 are paired. In the width direction of the floor passage 32, the joint plate portion 52 is located at the recess wall surface 63 side, and the joint plate portion 53 is located at the recess wall surface 64 side.

Each of the beads 55 and the passage plate portion 54 is interposed between the corresponding pair of the joint plate portions 52, 53. The beads 55 and the passage plate portion 54 are opposed to the recess 60 via the floor passage 32. The passage plate portion 54 extends in the width direction of the floor passage 32 and is opposed to the recess bottom surface 62 of the recess 60. The passage plate portion 54 extends over the fins 70 in the width direction of the floor passage 32. The passage plate portion 54 is arranged side by side relative to the joint plate portions 52, 53 along the main body floor 41 and is placed at the same height as the height of the joint plate portions 52, 53. The passage plate portion 54 overlaps with the fin distal end surfaces 72 of the fins 70 and extends along the fin distal end surfaces 72.

Each of the beads 55 is provided between the passage plate portion 54 and at least one of the joint plate portions 52, 53. In the present embodiment, the bead 55 is provided between the passage plate portion 54 and the joint plate portion 52 among the joint plate portions 52, 53 and joins between the passage plate portion 54 and the joint plate portion 52. None of the beads 55 is provided between the passage plate portion 54 and the joint plate portion 53. Each bead 55 is joined to the passage plate portion 54 and extends in an intersecting direction, which intersects the passage plate portion 54, and the bead 55 serves as a connection portion. The bead 55 extends in the upstream-to-downstream direction along the peripheral edge portion of the floor passage 32.

As shown in FIG. 6, at the lower cover 50, each bead 55 extends toward the recess 60 and enters the inside of the recess 60. The bead 55 projects from the joint plate portion 52 and the passage plate portion 54 and bulges into the inside of the recess 60. A vertical cross-section of the bead 55 is shaped in a curved form.

Figure 7:
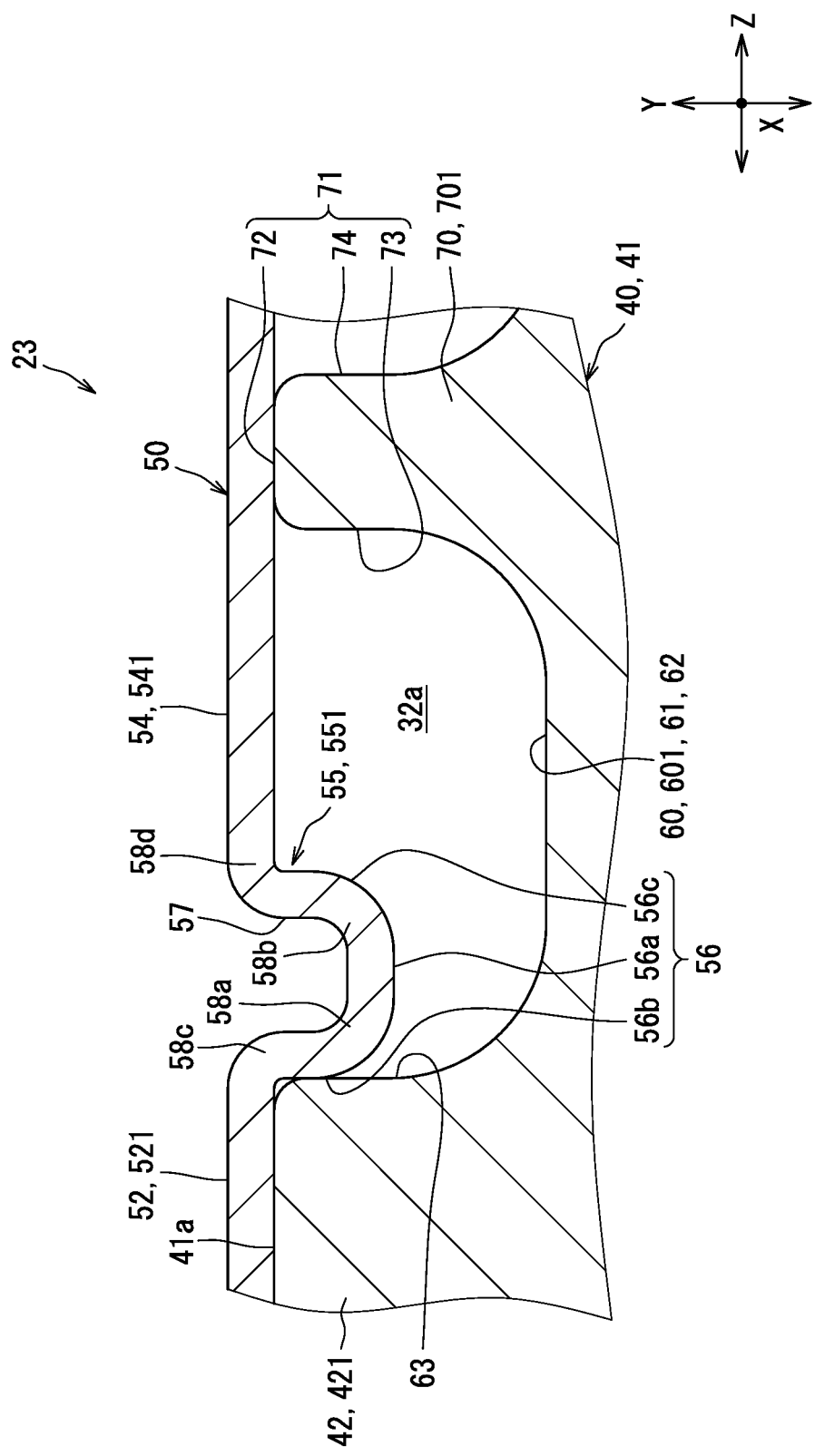
FIG. 7 is an enlarged view around an upstream wall-side bead shown in FIG. 6.

As shown in FIG. 7, each bead 55 has a bead outer surface 56 and a bead inner surface 57. The bead outer surface 56 is an outer surface of the bead 55 and faces the recess 60. The bead outer surface 56 is a curved surface that is curved to bulge toward the recess 60. The bead outer surface 56 includes a bead distal end surface 56a and bead lateral surfaces 56b, 56c. The bead distal end surface 56a is opposed to the recess bottom surface 62 and extends along the recess bottom surface 62. Each of the bead lateral surfaces 56b, 56c extends in an intersecting direction that intersects the joint plate portions 52, 53 and the passage plate portion 54. Among the bead lateral surfaces 56b, 56c, the bead lateral surface 56b extends from the joint plate portion 52 toward the recess bottom surface 62. The other bead lateral surface 56c extends from the passage plate portion 54 toward the recess bottom surface 62. The bead distal end surface 56a connects between the bead lateral surfaces 56b, 56c.

The bead 55 as a whole has a widely-flattened shape, so that the width dimension of the bead 55 in the Z direction is larger than the height dimension of the bead 55 in the Y direction. The width dimension of the bead outer surface 56 in the Z direction is larger than the projection dimension of the bead outer surface 56 in the Y direction. For example, a separation distance between the bead lateral surfaces 56b, 56c in the Z direction is larger than a separation distance in the Y direction between: the joint plate portion 52 and the passage plate portion 54; and the bead distal end surface 56a.

The bead inner surface 57 is an inner surface of the bead 55 and faces the side which is opposite to the recess 60. The bead inner surface 57 is a curved surface that is recessed toward the recess 60. The bead inner surface 57 opens toward the side which is opposite to the recess 60. The bead inner surface 57 enters the inside of the recess 60. A recess dimension (depth dimension) of the bead inner surface 57 in the Y direction is larger than a thickness dimension of each of the joint plate portions 52, 53 and the passage plate portion 54. The thickness dimension of each of the joint plate portions 52, 53 and the passage plate portion 54 is a thickness dimension of a plate material which forms the lower cover 50. The width dimension of the bead 55 in the perpendicular direction, which is perpendicular to the upstream-to-downstream direction of the floor passage 32, is larger than the height dimension of the bead 55.

According to the present embodiment, as described above, the floor passage 32 is curved to make the U-turn in FIGS. 3 and 6. One end of the floor passage 32 in the width direction of the floor passage 32 is an outer peripheral end, and the other end of the floor passage 32 in the width direction is an inner peripheral end. In the lower cover 50, among the joint plate portions 52, 53, the joint plate portion (hereinafter referred to as an outer joint plate portion) 52 is placed on the outer periphery side of the passage plate portion 54. The joint plate portion (hereinafter referred to as an inner joint plate portion) 53 is placed on the inner peripheral side of the passage plate portion 54. Each of the beads 55 is provided between the passage plate portion 54 and the outer joint plate portion 52 and joins between the passage plate portion 54 and the outer joint plate portion 52. In contrast, none of the beads 55 is provided between the passage plate portion 54 and the inner joint plate portion 53. The passage plate portion 54 and the inner joint plate portion 53 are directly joined with each other while the bead 55 is not interposed between the passage plate portion 54 and the inner joint plate portion 53.

As shown in FIGS. 3, 6 and 7, in the bead 55, among the bead lateral surfaces 56b, 56c, the bead lateral surface (hereinafter referred to as an outer bead lateral surface) 56b is placed on the outer peripheral side of the bead distal end surface 56a. The bead lateral surface (hereinafter referred to as an inner bead lateral surface) 56c is placed on the inner peripheral side of the bead distal end surface 56a. In the recess 60, among the recess wall surfaces 63, 64, the recess wall surface (hereinafter referred to as an outer recess wall surface) 63 is placed on the outer peripheral side of the recess bottom surface 62. The recess wall surface (hereinafter referred to as an inner recess wall surface) 64 is placed on the inner peripheral side of the recess bottom surface 62. In the main body floor 41, among the floor wall portions 42, 43, the floor wall portion (hereinafter referred to as an outer floor wall portion) 42 is placed on the outer peripheral side of the floor passage 32. The floor wall portion (hereinafter referred to as an inner floor wall portion) 43 is placed on the inner peripheral side of the floor passage 32. In the fin 70, among the fin lateral surfaces 73, 74, the fin lateral surface (hereinafter referred to as an outer fin lateral surface) 73 is placed on the outer peripheral side of the fin distal end surface 72. The fin lateral surface (hereinafter referred to as an inner fin lateral surface) 74 is placed on the inner peripheral side of the fin distal end surface 72.

As shown in FIGS. 6 and 7, the outer recess wall surface 63 of the recess 60 and the outer bead lateral surface 56b of the bead 55 are opposed to each other in the width direction of the floor passage 32. Furthermore, the outer fin lateral surface 73 of the fin 70 and the inner bead lateral surface 56c of the bead 55 are opposed to each other in the width direction of the floor passage 32. The outer recess wall surface 63 extends toward the outer joint plate portion 52 in the depth direction of the recess 60, and the inner recess wall surface 64 extends toward the inner joint plate portion 53 in the depth direction of the recess 60. The outer recess wall surface 63 and the inner recess wall surface 64 extend in the intersecting direction which intersects the passage plate portion 54. The outer recess wall surface 63 serves as an intersecting surface and a peripheral wall surface.

Each of the beads 55 is placed at a position, at which the bead 55 comes in contact with the outer recess wall surface 63 of the recess 60 in the width direction of the floor passage 32. The bead 55 is provided between: an outermost one of the fins 70, which is outermost on the outer peripheral side; and the outer floor wall portion 42. The outer bead lateral surface 56b of the bead 55 and the outer recess wall surface 63 are opposed to each other and contact with each other. The inner bead lateral surface 56c of the bead 55 and the outer fin lateral surface 73 of the fin 70, which is placed next to the bead 55, are opposed to each other and are spaced from each other in the width direction of the floor passage 32.

Each of the beads 55 contacts the outer recess wall surface 63. Even when the bead 55 is not in contact with the outer recess wall surface 63, the bead 55 is positioned so close to the outer recess wall surface 63 that the bead 55 comes in contact with the outer recess wall surface 63 in response to linear expansion of the refrigerant. When heat is generated in the electrical component, such as the converter unit 15 or the reactor unit 17, the heat is applied to the refrigerant to possibly cause the linear expansion of the refrigerant. When the linear expansion of the refrigerant occurs, the refrigerant urges the bead 55 toward the outer recess wall surface 63 to cause resilient deformation of the lower cover 50, and thereby the bead 55 comes in contact with the outer recess wall surface 63.

The position, at which the bead 55 comes in contact with the outer recess wall surface 63, may be: a contact position, at which the bead 55 is in contact with the outer recess wall surface 63; or a contactable position, at which the bead 55 is spaced from the outer recess wall surface 63 within an extent that enables the bead 55 to come in contact with the outer recess wall surface 63. In the configuration, in which the bead 55 is placed in the contactable position, the separation distance between the bead 55 and the outer recess wall surface 63 is reduced when the bead 55 comes in contact with the outer recess wall surface 63 in response to the resilient deformation of the lower cover 50. In the present embodiment, the bead 55 is placed in one of the contact position and the contactable position.

Each bead 55 has distal end curved portions 58a, 58b and base end curved portions 58c, 58d. The distal end curved portions 58a, 58b are arranged one after the other in the width direction of the bead 55. In the bead 55, the distal end curved portion 58a, which is placed on the outer peripheral side, joins between the bead distal end surface 56a and the outer bead lateral surface 56b. The distal end curved portion 58b, which is placed on the inner peripheral side, joins between the bead distal end surface 56a and the inner bead lateral surface 56c. Each of the distal end curved portions 58a, 58b is curved to bulge toward the recess bottom surface 62.

The base end curved portions 58c, 58d are arranged one after the other in the width direction of the bead 55. In the bead 55, the base end curved portion 58c, which is placed on the outer peripheral side, joins between the outer bead lateral surface 56b and the outer joint plate portion 52. The base end curved portion 58d, which is placed on the inner peripheral side, joins between the inner bead lateral surface 56c and the passage plate portion 54. Each of the base end curved portions 58c, 58d is curved to bulge toward the side which is opposite to the recess bottom surface 62.

In the case 20, the internal pressure, which is applied from the refrigerant of the floor passage 32 to the recess 60 and/or the lower cover 50, may increase. The increasing of the internal pressure in the floor passage 32 may occur in a case where pulsations occur in the flow of the refrigerant in response to the driving of the pump for flowing the refrigerant. Furthermore, there is also a case where the linear expansion of the refrigerant occurs due to the heat generated by the converter unit 15 and/or the reactor unit 17.

Now, there is assumed a configuration, in which the bead 55 is not provided between the pair of joint plate portions 52, 53 at the lower cover 50 unlike the present embodiment. In this configuration, the outer joint plate portion 52 and the passage plate portion 54 are directly joined with each other while the bead 55 is not interposed between the outer joint plate portion 52 and the passage plate portion 54. Therefore, there is a concern that the stress, which is caused by the internal pressure increase in the floor passage 32, is concentrated at a part of the lower cover 50, such as the inner peripheral end of the joint 37. When a stress is concentrated at the part of the lower cover 50, the lower cover 50 may be locally deformed to result in plastic deformation of the lower cover 50.

In the configuration, in which the bead 55 is not provided to the lower cover 50, a boundary between the outer joint plate portion 52 and the passage plate portion 54 is placed adjacent to the inner peripheral end of the joint 37. Therefore, the plastic deformation, which is generated at the lower cover 50 at the location around the inner peripheral end of the joint 37, tends to cause movement of the passage plate portion 54 relative to the outer joint plate portion 52 toward the side, which is opposite to the recess 60.

In contrast, in the present embodiment, as discussed above, the bead 55 is placed at the position, at which the bead 55 comes in contact with the outer recess wall surface 63. According to this configuration, the stress, which is generated due to the internal pressure increase in the floor passage 32, urges the bead 55 against the outer recess wall surface 63 and is thereby applied to the outer recess wall surface 63 through the bead 55. As discussed above, by applying the stress from the lower cover 50 to the outer recess wall surface 63, the concentration of the stress at the part of the lower cover 50, such as the inner peripheral end of the joint 37, is less likely to occur. Therefore, the localized deformation of the lower cover 50 caused by the concentration of the stress at the part of the lower cover 50 is limited, and thereby the plastic deformation of the lower cover 50 caused by the localized deformation of the lower cover 50 is limited.

In the present embodiment, the bead 55 is provided to each of the upstream passage 32a and the downstream passage 32b. The bead 55, which is provided to the upstream passage 32a, will be also referred to as an upstream wall-side bead 551, and the bead 55, which is provided to the downstream passage 32b, will be also referred to as a downstream wall-side bead 552. A portion of the outer joint plate portion 52, which is provided to the upstream passage 32a, will be also referred to as an upstream joint plate portion 521, and a portion of the outer joint plate portion 52, which is provided to the downstream passage 32b, will be also referred to as a downstream joint plate portion 522. A portion of the passage plate portion 54, which is provided to the upstream passage 32a, will be also referred to as an upstream passage plate portion 541, and a portion of the passage plate portion 54, which is provided to the downstream passage 32b, will be also referred to as a downstream passage plate portion 542.

A portion of the recess 60, which forms the upstream passage 32a, will be also referred to as an upstream recess portion 601, and a portion of the recess 60, which forms the downstream passage 32b, will be also referred to as a downstream recess portion 602. A portion of the outer recess wall surface 63, which forms the upstream passage 32a, will be also referred to as an upstream recess wall surface 631, and a portion of the outer recess wall surface 63, which forms the downstream passage 32b, will be also referred to as a downstream recess wall surface 632. A portion of each fin 70, which is located in the upstream passage 32a, will be also referred to as an upstream fin 701, and a portion of each fin 70, which is located in the downstream passage 32b, will be also referred to as a downstream fin 702. In the main body floor 41, a portion of the outer floor wall portion 42, which forms the upstream passage 32a, will be also referred to as an upstream floor wall portion 421, and a portion of the outer floor wall portion 42, which forms the downstream passage 32b, will be also referred to as a downstream floor wall portion 422.

The inner floor wall portion 43 of the main body floor 41 is located between the upstream recess portion 601 and the downstream recess portion 602. The inner floor wall portion 43 partitions between the upstream passage 32a and the downstream passage 32b and serves as the partition. The lower cover 50 extends over the upstream passage 32a and the downstream passage 32b across the inner floor wall portion 43. In other words, the lower cover 50 extends over the upstream floor wall portion 421 and the downstream floor wall portion 422 across the inner floor wall portion 43, the upstream recess portion 601 and the downstream recess portion 602. In the lower cover 50, the inner joint plate portion 53 is located between the upstream passage plate portion 541 and the downstream passage plate portion 542. The inner joint plate portion 53 joins between the upstream passage plate portion 541 and the downstream passage plate portion 542.

The upstream wall-side bead 551 is placed at a position, at which the upstream wall-side bead 551 comes in contact with the outer recess wall surface 63 of the upstream recess portion 601. The upstream wall-side bead 551 is located between and joins between the upstream joint plate portion 521 and the upstream passage plate portion 541 in the width direction of the upstream passage 32a. The downstream wall-side bead 552 is placed at a position, at which the downstream wall-side bead 552 comes in contact with the outer recess wall surface 63 of the downstream recess portion 602. The downstream wall-side bead 552 is located between and joins between the downstream joint plate portion 522 and the downstream passage plate portion 542 in the width direction of the downstream passage 32b.

The upstream passage 32a serves as a first passage, and the downstream passage 32b serves as a second passage. The Z direction serves as a side-by-side direction that is a direction, along which the first passage and the second passage are arranged side by side. The upstream joint plate portion 521 serves as a joint plate portion and a first joint plate portion. The downstream joint plate portion 522 serves as a joint plate portion and a second joint plate portion. The inner joint plate portion 53 serves as a joint plate portion and a partition joint plate portion. The upstream passage plate portion 541 serves as a passage plate portion and a first passage plate portion. The downstream passage plate portion 542 serves as a passage plate portion and a second passage plate portion. The upstream wall-side bead 551 serves as a connection portion, a contactable connection portion, a wall-side connection portion, and a first connection portion. The downstream wall-side bead 552 serves as a connection portion, a contactable connection portion, a wall-side connection portion, and a second connection portion. The upstream recess wall surface 631 serves as an intersecting surface and a first peripheral wall surface. The downstream recess wall surface 632 serves as an intersecting surface and a second peripheral wall surface.

Next, the manufacturing method of the case 20 will be described as the manufacturing method of the electric power converter apparatus 10. A manufacturing process of the electric power converter apparatus 10 includes a manufacturing process of the case 20 and an installation process of installing the electrical components, such as the converter unit 15, into the inside of the case 20.

In the manufacturing process of the case 20, an operator forms the case main body 40 and the lower cover 50. Thereafter, the operator performs a temporarily assembling step of temporarily assembling the lower cover 50 to the case main body 40. At this temporarily assembling step, with reference to FIGS. 3 and 6, the lower cover 50 is temporarily assembled to the main body floor 41 of the case main body 40 such that the upstream wall-side bead 551 is inserted in the inside of the upstream recess portion 601, and the downstream wall-side bead 552 is inserted in the inside of the downstream recess portion 602. In this case, the upstream wall-side bead 551 and the downstream wall-side bead 552 are fitted between the upstream recess wall surface 631 and the downstream recess wall surface 632. Therefore, by contacting the wall-side beads 551, 552 to the outer recess wall surface 63, a positional deviation of the lower cover 50 relative to the case main body 40 in the Z direction is limited.

After the temporarily assembling step, a joining step is performed. In the joining step, the case main body 40 and the lower cover 50 are fixed together by friction stir welding. The friction stir welding is a joining method where a tool, which is rotated at a high speed, is urged against the lower cover 50, so that heat and pressure generated by friction between the tool and the lower cover 50 join the lower cover 50 to the main body floor 41. At the manufacturing time of the case 20, the friction stir welding is applied continuously along the peripheral edge portion of the recess 60, so that the joint 37 is formed in an order of the first to sixth joint portions 37a-37f. As indicated by a dot-dot-dash line in FIG. 4, the joint 37 is formed with one stroke such that the friction stir joining starts at a start point 38A closest to the curved passage 32c at the first joint portion 37a and ends at an end point 38B closest to the upstream passage 32a at the sixth joint portion 37f. The friction stir welding is also referred to as FSW.

At the joining step, the heat, which is generated by the friction stir welding, may cause linear expansion of the main body floor 41 of the case main body 40 and the lower cover 50. Unlike the present embodiment, for example, in the configuration in which the bead 55 is not formed at the lower cover 50, when the linear expansion of the main body floor 41 or the lower cover 50 occurs, there is a concern that the stress due to the linear expansion is concentrated in the part of the lower cover 50, such as the inner peripheral end of the joint 37. In this case, as in the completed electric power converter apparatus 10, it is conceivable that the stress is concentrated at the part of the lower cover 50, and the lower cover 50 is locally deformed, resulting in plastic deformation of the lower cover 50.

In contrast, in the case where the joining work at the joining step is performed, the wall-side beads 551, 552 are placed in a state where the wall-side beads 551, 552 are in contact with the outer recess wall surface 63. For this reason, the stress, which is generated by the linear expansion of, for example, the lower cover 50, is applied from the wall-side bead 551, 552 to the outer recess wall surface 63 in the same way as in the completed electric power converter apparatus 10, thereby limiting the plastic deformation of the lower cover 50.

The method of joining the case main body 40 and the lower cover 50 is not necessarily the friction stir welding. For example, the case main body 40 and the lower cover 50 may be joined by ordinary welding or a bonding agent.

According to the present embodiment described above, each wall-side bead 551, 552, which extends in the intersecting direction that intersects the passage plate portion 54, comes in contact with the outer recess wall surface 63, which extends in the intersecting direction that intersects the passage plate portion 54. Therefore, even when the stress is generated due to the internal pressure increase in the floor passage 32 and/or the linear expansion of the lower cover 50, this stress is applied from the wall-side bead 551, 552 to the outer recess wall surface 63. Thus, the localized deformation of the lower cover 50 caused by the concentration of the stress at the part of the lower cover 50 is limited, and thereby the plastic deformation of the lower cover 50 caused by the localized deformation of the lower cover 50 is limited. As a result, the floor passage 32, which is formed by the lower cover 50, can be kept in an appropriate state.

According to the present embodiment, the wall-side beads 551, 552 are in contact with the outer recess wall surface 63. Therefore, even when the stress is generated due to, for example, the internal pressure increase in the floor passage 32, this stress is applied from the wall-side bead 551, 552 to the outer recess wall surface 63 without waiting for the resilient deformation of the lower cover 50 caused by this stress. Thus, the stress can be more reliably applied from the lower cover 50 to the outer recess wall surface 63.

According to the present embodiment, the outer recess wall surface 63, which is in contact with the wall-side beads 551, 552, forms the peripheral edge portion of the floor passage 32. In this configuration, the stress, which is applied from the wall-side bead 551, 552 to the outer recess wall surface 63, is applied to the outer floor wall portion 42, which forms the outer recess wall surface 63. The outer floor wall portion 42 is stronger than, for example, the fin 70. This is due to the fact that a volume of the outer floor wall portion 42 is larger than that of the fin 70, and the outer floor wall portion 42 forms the main body lower surface 41a. Therefore, even when the stress is applied from the wall-side bead 551, 552 to the outer recess wall surface 63, this stress hardly causes the deformation of the outer floor wall portion 42. Therefore, the floor passage 32, which is formed by the outer floor wall portion 42, can be kept in the appropriate state.

According to the present embodiment, since each of the wall-side beads 551, 552 is curved, the entire wall-side bead 551, 552 is easily resiliently deformed. Therefore, when it is impossible to apply all the stress from the wall-side beads 551, 552 to the outer recess wall surface 63, the individual wall-side bead 551, 552 can be deformed as a whole to limit the concentration of the remaining stress at a part of the wall-side bead 551, 552.

According to the present embodiment, since the outer bead lateral surface 56b of each wall-side bead 551, 552 comes in contact with the outer recess wall surface 63, the contact surface area between the wall-side bead 551, 552 and the outer recess wall surface 63 tends to increase. Therefore, the stress is less likely to be concentrated at a part of the contact portion between the wall-side bead 551, 552 and the outer recess wall surface 63. Thus, it is possible to limit the occurrence of the plastic deformation of the wall-side bead 551, 552 caused by localized deformation of the contact portion of the wall-side bead 551, 552 which is in contact with the outer recess wall surface 63.

According to the present embodiment, the upstream wall-side bead 551 contacts the upstream recess wall surface 631 in the upstream passage 32a, and the downstream wall-side bead 552 contacts the downstream recess wall surface 632 in the downstream passage 32b. Therefore, the stress, which is generated due to, for example, the internal pressure increase in the floor passage 32 and/or the linear expansion of the lower cover 50, is applied from the upstream wall-side bead 551 to the upstream recess wall surface 631 and is applied from the downstream wall-side bead 552 to the downstream recess wall surface 632. Thus, in each of the upstream passage 32a and the downstream passage 32b, the localized deformation of the lower cover 50 caused by the concentration of the stress at the part of the lower cover 50 is limited, and thereby the plastic deformation of the lower cover 50 caused by the localized deformation of the lower cover 50 is limited. As a result, the upstream passage 32a and the downstream passage 32b, which are formed by the lower cover 50, can be kept in the appropriate state.

In the present embodiment, the lower cover 50 extends over the upstream passage 32a and the downstream passage 32b across the inner floor wall portion 43. In this lower cover 50, it is assumed that the stress, which is generated due to, for example, the internal pressure increase in the floor passage 32 and/or the linear expansion of the lower cover 50, is easily transmitted from the center side toward the outer peripheral edge. Therefore, in the lower cover 50, the stress is more likely to be concentrated at the part of the lower cover 50, such as the inner peripheral end of the joint 37, and this is more likely to occur at the outer joint plate portion 52 than the inner joint plate portion 53.

In contrast, according to the present embodiment, the wall-side beads 551, 552 are joined to the outer joint plate portion 52. With respect to the outer joint plate portion 52 where the stress tends to be concentrated in the part, such as the inner peripheral end of the joint 37, it is effective to limit the plastic deformation of the lower cover 50 by the wall-side beads 551, 552.

Second Embodiment

In the first embodiment discussed above, each bead 55 is placed at the position, at which the bead 55 comes in contact with the outer recess wall surface 63 of the recess 60. In contrast, in a second embodiment, each bead 55 is placed at a position, at which the bead 55 comes in contact with the inner fin lateral surface 74 of the fin 70. The configuration, the operation and the effect not specifically described in the second embodiment are the same as those in the first embodiment. In the second embodiment, points, which are different from the first embodiment, will be mainly described.

Figure 8:
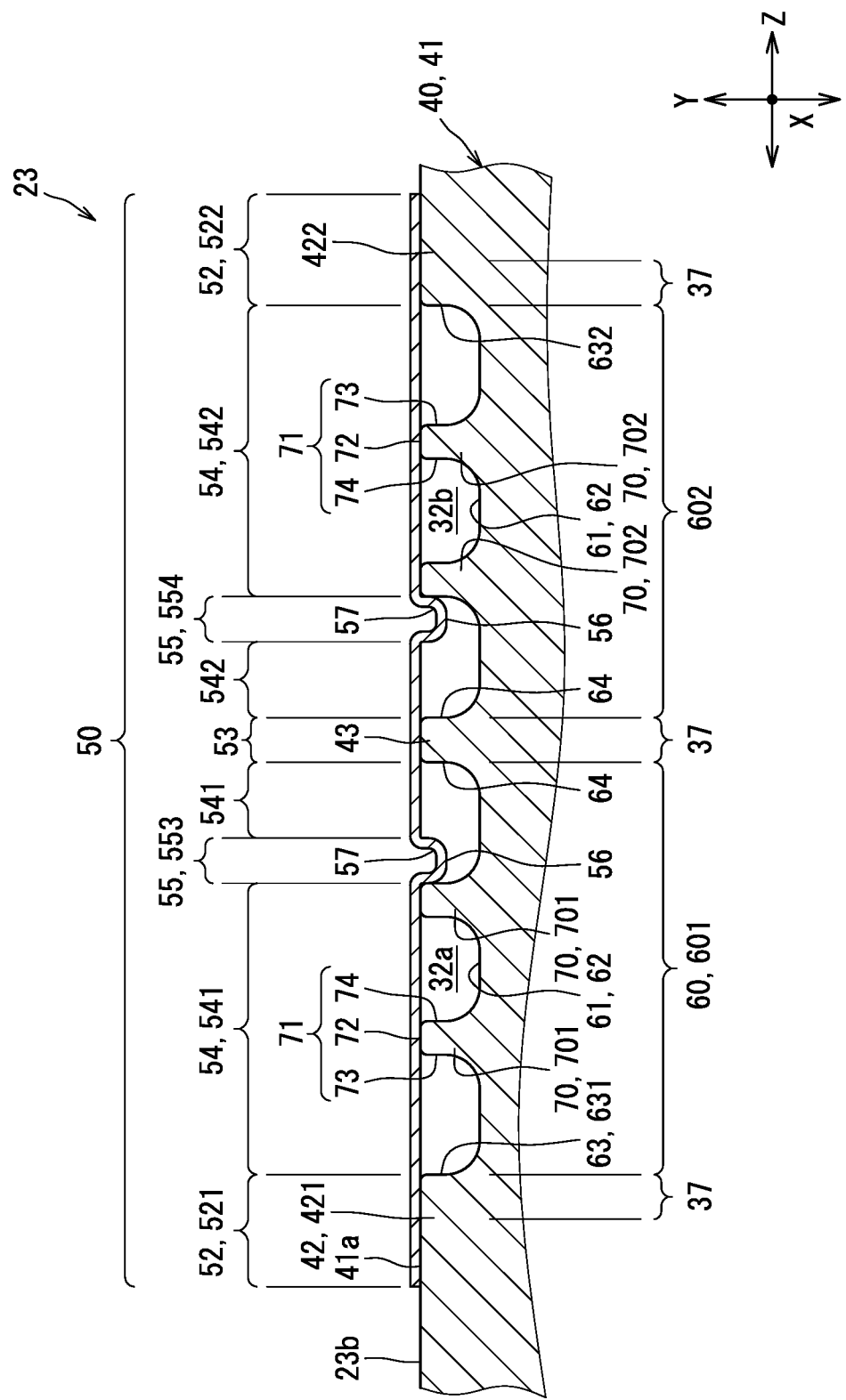
FIG. 8 is a vertical cross-sectional view of a floor passage of a second embodiment.
Figure 9:
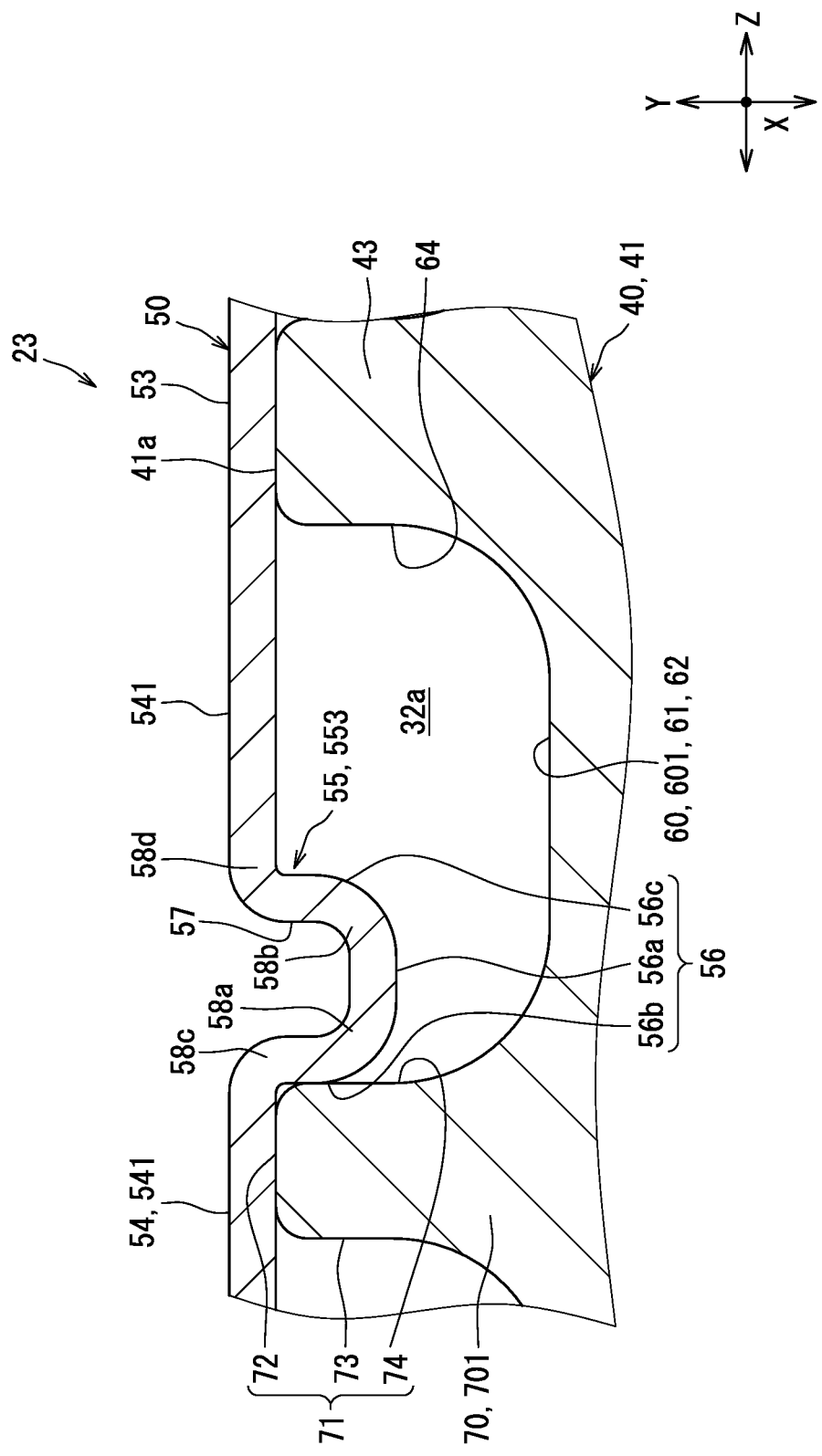
FIG. 9 is an enlarged view around an upstream fin-side bead shown in FIG. 8.

In the present embodiment, as shown in FIGS. 8 and 9, each bead 55 is placed at the position, which is spaced from each of the recess wall surfaces 63, 64 of the recess 60 in the width direction of the floor passage 32. The lower cover 50 includes a plurality of the passage plate portions 54 unlike the first embodiment. One of the passage plate portions 54 is provided between the corresponding bead 55 and the outer joint plate portion 52, and another one of the passage plate portions 54 is provided between the corresponding bead 55 and the inner joint plate portion 53. In the lower cover 50, the bead 55 is provided between and joins between the passage plate portion 54, which is located on the outer joint plate portion 52 side, and the passage plate portion 54, which is located on the inner joint plate portion 53 side. The passage plate portion 54, which is located on the outer joint plate portion 52 side, joins between the outer joint plate portion 52 and the bead 55. The passage plate portion 54, which is located on the inner joint plate portion 53 side, joins between the inner joint plate portion 53 and the bead 55.

The bead 55 is provided between and joins between the two passage plate portions 54, which are arranged side by side in the width direction of the floor passage 32. The bead 55 is joined to the two passage plate portions 54 and extends in an intersecting direction, which intersects the passage plate portion 54. In the present embodiment, each bead 55 does not directly contact any of the joint plate portions 52, 53.

Each of the beads 55 is placed at a position, at which the bead 55 comes in contact with the inner fin lateral surface 74 of the fin 70 in the width direction of the floor passage 32. Each bead 55 is provided between: an innermost one of the fins 70, which is innermost on the inner peripheral side; and the inner floor wall portion 43. The outer bead lateral surface 56b of each bead 55 and the inner fin lateral surface 74 of the innermost fin 70 are opposed to each other and are in contact with each other. The inner bead lateral surface 56c of each bead 55 and the inner recess wall surface 64 are opposed to each other and are spaced from each other in the width direction of the floor passage 32. The inner fin lateral surface 74 serves as an intersecting surface and a fin lateral surface.

In the present embodiment, since each of the beads 55 is placed at the position, at which the bead 55 comes in contact with the inner fin lateral surface 74, the stress, which is generated due to the internal pressure increase in the floor passage 32, urges the bead 55 against the inner fin lateral surface 74 and is thereby applied to the inner fin lateral surface 74 through the bead 55. As discussed above, by applying the stress from the lower cover 50 to the inner fin lateral surface 74, the concentration of the stress at the part of the lower cover 50, such as the inner peripheral end of the joint 37, is less likely to occur. Therefore, like in the first embodiment, the localized deformation of the lower cover 50 caused by the concentration of the stress at the part of the lower cover 50 is limited, and thereby the plastic deformation of the lower cover 50 caused by the localized deformation of the lower cover 50 is limited.

In the present embodiment, like in the first embodiment, the bead 55 is provided to each of the upstream passage 32a and the downstream passage 32b. The bead 55, which is provided to the upstream passage 32a, will be also referred to as an upstream fin-side bead 553, and the bead 55, which is provided to the downstream passage 32b, will be also referred to as a downstream fin-side bead 554.

The upstream fin-side bead 553 is placed at a position, at which the upstream fin-side bead 553 comes in contact with the inner fin lateral surface 74 of the upstream fin 701. The upstream fin-side bead 553 is provided between and joins between the two upstream passage plate portions 541, which are arranged side by side in the width direction of the upstream passage 32a. The downstream fin-side bead 554 is placed at a position, at which the downstream fin-side bead 554 comes in contact with the inner fin lateral surface 74 of the downstream fin 702. The downstream fin-side bead 554 is provided between and joins between the two downstream passage plate portions 542 which are arranged side by side in the width direction of the downstream passage 32b. Each fin-side bead 553, 554 serves as a connection portion, a contactable connection portion, and a fin-side connection portion.

Next, the manufacturing method of the case 20 will be described. When the lower cover 50 is temporarily assembled to the case main body 40 at the temporarily assembling step, the upstream fin-side bead 553 and the downstream fin-side bead 554 are fitted between the upstream fin 701 and the downstream fin 702. In this case, by contacting the fin-side beads 553, 554 to the inner fin lateral surface 74, a positional deviation of the lower cover 50 relative to the case main body 40 in the Z direction is limited.

In the case where the joining operation is performed after the temporarily assembling step, each of the fin-side beads 553, 554 is placed in a state where the fin-side bead 553, 554 is in contact with the inner fin lateral surface 74. For this reason, the stress, which is generated by, for example, the linear expansion of the lower cover 50, is applied from the fin-side bead 553, 554 to the inner fin lateral surface 74 in the same way as in the completed electric power converter apparatus 10, thereby limiting the plastic deformation of the lower cover 50.

According to the present embodiment, each of the fin-side beads 553, 554, which extends in the intersecting direction that intersects the passage plate portion 54, comes in contact with the inner fin lateral surface 74, which extends in the intersecting direction that intersects the passage plate portion 54. Therefore, even when the stress is generated due to, for example, the internal pressure increase in the floor passage 32 and/or the linear expansion of the lower cover 50, this stress is applied from the fin-side bead 553, 554 to the inner fin lateral surface 74. Therefore, the plastic deformation of the lower cover 50 can be limited by the fin-side beads 553, 554.

According to the present embodiment, each of the fin-side beads 553, 554 is in contact with the inner fin lateral surface 74. Therefore, even when the stress is generated due to, for example, the internal pressure increase in the floor passage 32, this stress is applied from the fin-side bead 553, 554 to the inner fin lateral surface 74 without waiting for the resilient deformation of the lower cover 50 caused by this stress. Thus, the stress can be more reliably applied from the lower cover 50 to the inner fin lateral surface 74.

According to the present embodiment, the inner fin lateral surface 74 is included in the fin outer surface 71 of the fin 70. According to this configuration, the stress, which is applied from the fin-side bead 553, 554 to the inner fin lateral surface 74, is applied to the fin 70. Therefore, the fin 70 can enhance the cooling effect with the refrigerant by increasing a contact surface area between the recess inner surface 61 of the recess 60 and the refrigerant in the floor passage 32 and can limit the localized deformation of the lower cover 50.

According to the present embodiment, since each of the fin-side beads 553, 554 is curved, the entire fin-side bead 553, 554 is easily resiliently deformed. Therefore, when it is impossible to apply all the stress from the fin-side bead 553, 554 to the inner fin lateral surface 74, the individual fin-side bead 553, 554 can be resiliently deformed as a whole to limit the concentration of the remaining stress at a part of the fin-side bead 553, 554.

According to the present embodiment, since the outer bead lateral surface 56b of each fin-side bead 553, 554 comes in contact with the inner fin lateral surface 74, the contact surface area between the fin-side bead 553, 554 and the fin 70 tends to be increased. Therefore, the stress is less likely to be concentrated at a part of the contact portion between the fin-side bead 553, 554 and the inner fin lateral surface 74. Thus, it is possible to limit the occurrence of the plastic deformation of the fin-side bead 553, 554 caused by localized deformation of the contact portion of the fin-side bead 553, 554 which is in contact with the fin 70.

Third Embodiment

In the first embodiment described above, the bead 55 is placed at the position, at which the bead 55 comes in contact with the outer recess wall surface 63. Furthermore, in the second embodiment, the bead 55 is placed at the position, at which the bead 55 comes in contact with the inner fin lateral surface 74. In contrast, in a third embodiment, each of the beads 55 is placed at a corresponding one of: a position, at which the bead 55 comes in contact with the outer recess wall surface 63; and a position, at which the bead 55 comes in contact with the inner fin lateral surface 74 of the corresponding fin 70. The configuration, the operation and the effect not specifically described in the third embodiment are the same as those in the first and second embodiments. In the third embodiment, points, which are different from the first and second embodiments, will be mainly described.

Figure 10:
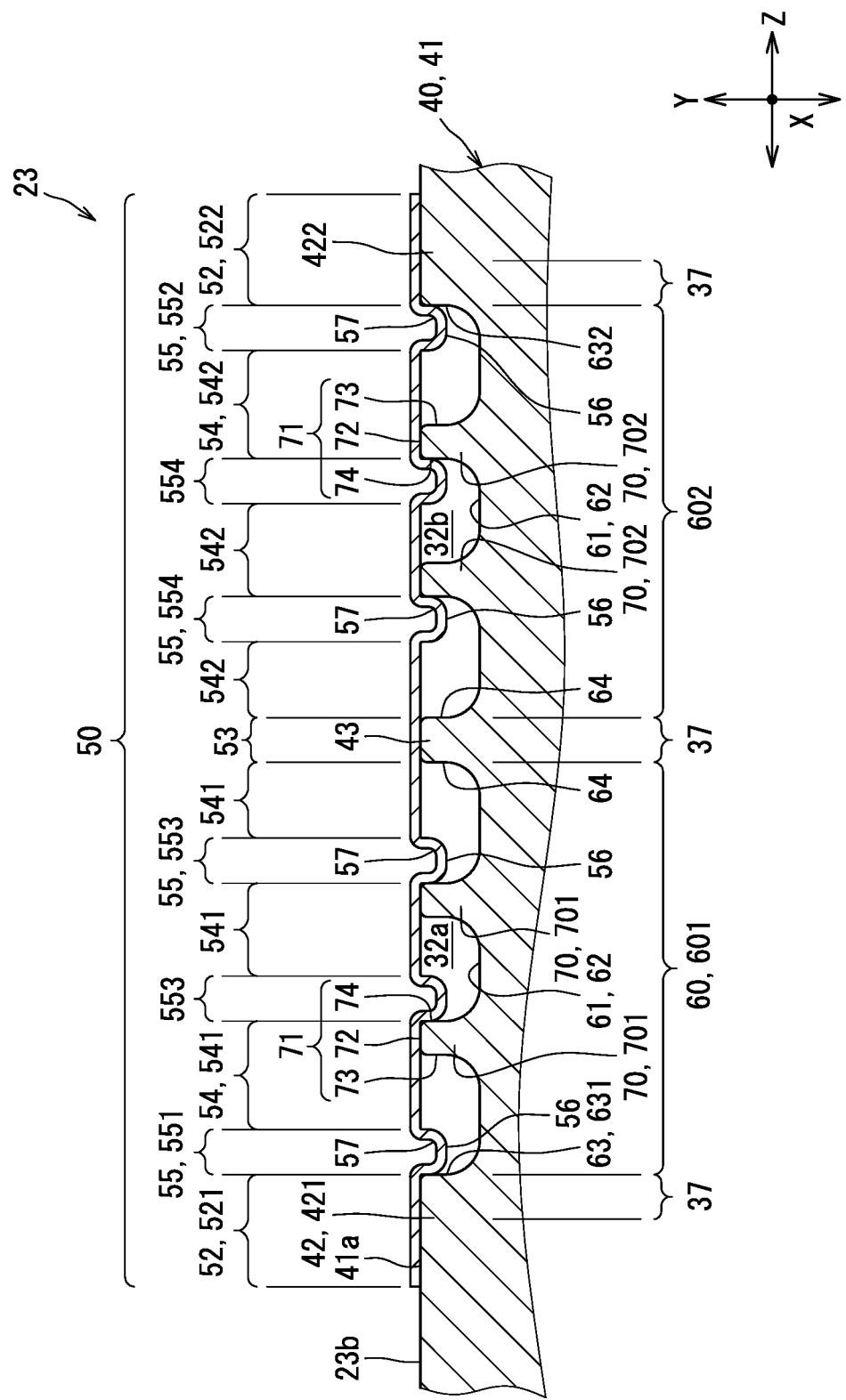
FIG. 10 is a vertical cross-sectional view of a floor passage of a third embodiment.

As shown in FIG. 10, a plurality of beads 55 are provided to each of the upstream passage 32a and the downstream passage 32b. In the upstream passage 32a, the beads 55 are arranged side by side in the width direction of the upstream passage 32a, and a corresponding one of the fins 70 is interposed between each adjacent two of the beads 55. In the downstream passage 32b, the beads 55 are arranged side by side in the width direction of the downstream passage 32b, and a corresponding one of the fins 70 is interposed between each adjacent two of the beads 55. The plurality of beads 55 include the wall-side beads 551, 552 of the first embodiment and the fin-side beads 553, 554 of the second embodiment.

In the upstream passage 32a, a plurality of upstream fin-side beads 553 are provided. The upstream fin-side beads 553 are arranged side by side in the width direction of the upstream passage 32a and are respectively placed at positions, at which the upstream fin-side beads 553 come in contact with the different upstream fins 701, respectively. For example, one of adjacent two upstream fin-side beads 553 is provided between the inner floor wall portion 43 and the upstream fin 701 located next to the inner floor wall portion 43 and contacts the inner fin lateral surface 74 of this upstream fin 701. The other one of the adjacent two upstream fin-side beads 553 is provided between the adjacent two upstream fins 701 and contacts the inner fin lateral surface 74 of the upstream fin 701 located on the side of this upstream fin-side bead 553 that is opposite to the inner floor wall portion 43.

In the downstream passage 32b, a plurality of downstream fin-side beads 554 are provided. The downstream fin-side beads 554 are arranged side by side in the width direction of the downstream passage 32b and are respectively placed at positions, at which the downstream fin-side beads 554 come in contact with the different downstream fins 702, respectively. For example, one of adjacent two downstream fin-side beads 554 is provided between the inner floor wall portion 43 and the downstream fin 702 located next to the inner floor wall portion 43 and contacts the inner fin lateral surface 74 of this downstream fin 702. The other one of the adjacent two downstream fin-side beads 554 is provided between the adjacent two downstream fins 702 and contacts the inner fin lateral surface 74 of the downstream fin 702 located on the side of this downstream fin-side bead 554 that is opposite to the inner floor wall portion 43.

Fourth Embodiment

In a fourth embodiment, the outer recess wall surface 63 of the recess 60 has a sloped surface 68. The configuration, the operation and the effect not specifically described in the fourth embodiment are the same as those in the first to third embodiments. In the fourth embodiment, points, which are different from the third embodiment, will be mainly described.

Figure 11:
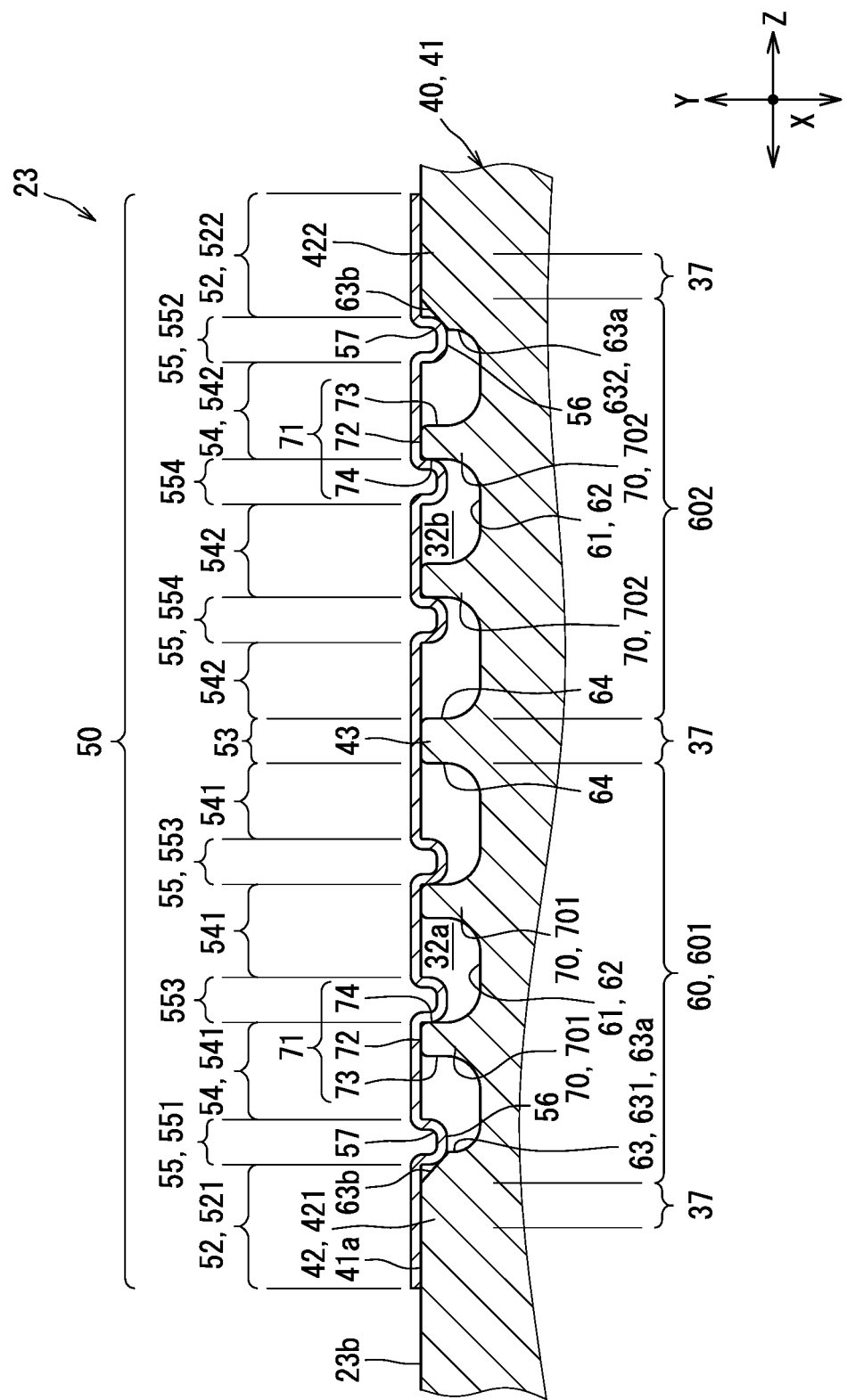
FIG. 11 is a vertical cross-sectional view of a floor passage of a fourth embodiment.
Figure 12:
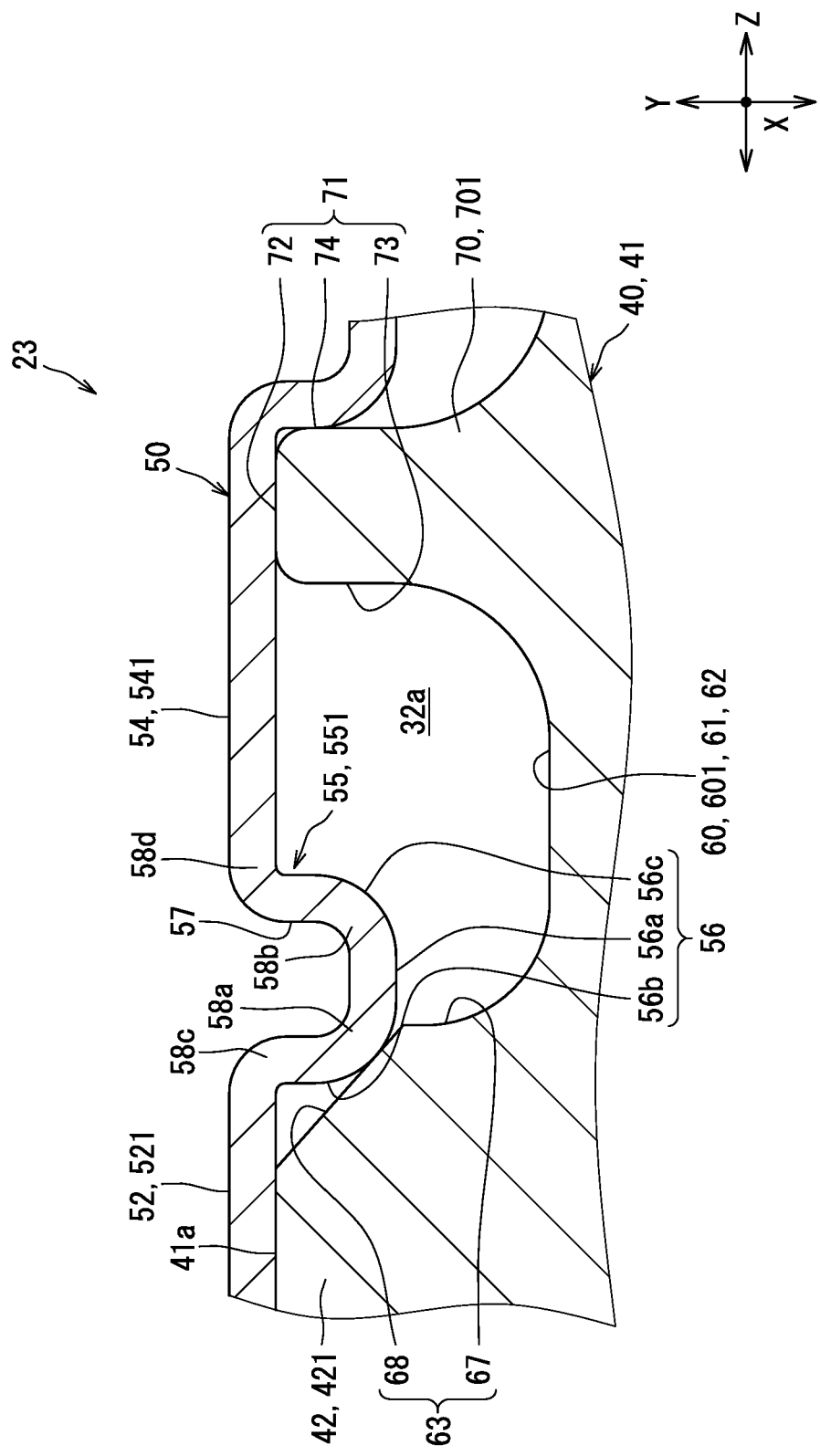
FIG. 12 is an enlarged view around an upstream wall-side bead shown in FIG. 11.

As shown in FIGS. 11 and 12, the outer recess wall surface 63 of the recess 60 has a rising surface 67 and the sloped surface 68. The rising surface 67 forms an end portion of the outer recess wall surface 63 which is adjacent to the recess bottom surface 62. The rising surface 67 extends in the depth direction of the recess 60 that is also the intersecting direction which intersects the lower cover 50. The sloped surface 68 is located on a side of the rising surface 67, which is opposite to the recess bottom surface 62 in the depth direction of the recess 60, and the sloped surface 68 forms an end surface of the outer recess wall surface 63, which is adjacent to the main body lower surface 41a. The sloped surface 68 extends in a direction that is tilted relative to both the rising surface 67 and the main body lower surface 41a, and the sloped surface 68 joins between the rising surface 67 and the main body lower surface 41a. A degree of tilt of the sloped surface 68 relative to the depth direction of the recess 60 is larger than a degree of tilt of the rising surface 67 relative to the depth direction of the recess 60. The vertical cross-section of the recess 60 is shaped such that a convex corner between the outer recess wall surface 63 and the main body lower surface 41a is cut out by the sloped surface 68.

The beads 55 at each of the upstream passage 32a and the downstream passage 32b include the bead 55 that is placed at a position, at which the bead 55 comes in contact with the sloped surface 68 of the outer recess wall surface 63. For example, each of the upstream wall-side bead 551 and the downstream wall-side bead 552 is placed at the position, at which the bead 551, 552 comes in contact with the sloped surface 68 of the outer recess wall surface 63.

The wall-side bead 551, 552 is placed on the sloped surface 68 side of the rising surface 67 in the depth direction of the recess 60. The rising surface 67 and each wall-side bead 551, 552 are arranged side by side in the depth direction of the recess 60. The wall-side bead 551, 552 and the sloped surface 68 are arranged side by side in the width direction of the floor passage 32. At least a portion of the bead outer surface 56 of the wall-side bead 551, 552 contacts the sloped surface 68. In the wall-side bead 551, 552, the distal end curved portion 58a, which is placed on the outer peripheral side, is closest to the sloped surface 68 and is most likely to contact the sloped surface 68.

The sloped surface 68 is tilted such that the sloped surface 68 extends along the distal end curved portion 58a which is placed on the outer peripheral side. Therefore, when the distal end curved portion 58a, which is placed on the outer peripheral side, contacts the sloped surface 68, a contact surface area between the wall-side bead 551, 552 and the outer recess wall surface 63 tends to be increased. Therefore, the concentration of the stress at a part of the contact portion between the wall-side bead 551, 552 and the outer recess wall surface 63 is limited by the contact between the distal end curved portion 58a, which is placed on the outer peripheral side, and the sloped surface 68. The sloped surface 68 is tilted relative to the outer bead lateral surface 56b and the inner bead lateral surface 56c of the wall-side bead 551, 552.

According to the present embodiment, in the outer recess wall surface 63, the sloped surface 68, to which the wall-side bead 551, 552 comes in contact, is tilted relative to the depth direction of the recess 60. Therefore, even when the position of the wall-side bead 551, 552 relative to the outer recess wall surface 63 is slightly deviated in the width direction of the floor passage 32 due to, for example, a manufacturing error, the wall-side bead 551, 552 can easily come in contact with the sloped surface 68 of the outer recess wall surface 63.

In a case where the lower cover 50 is resiliently deformed due to, for example, the internal pressure increase in the floor passage 32, the wall-side bead 551, 552 may possibly tilt such that the opening of the bead inner surface 57 faces the outer recess wall surface 63 side. In this case, when the tilt angle of the outer bead lateral surface 56b approaches the tilt angle of the sloped surface 68, the outer bead lateral surface 56b of the wall-side bead 551, 552 easily comes in contact with the sloped surface 68. As for the lower cover 50, the contact surface area between the wall-side bead 551, 552 and the outer recess wall surface 63 tends to be increased regardless of which one of the distal end curved portion 58a placed on the outer peripheral side and the outer bead lateral surface 56b contacts the sloped surface 68. Therefore, the concentration of the stress at the part of the contact portion between the wall-side bead 551, 552 and the outer recess wall surface 63 can be further limited by the sloped surface 68 even when the lower cover 50 is deformed.

Fifth Embodiment

In the fourth embodiment described above, the outer bead lateral surface 56b of the bead 55 is tilted relative to the sloped surface 68 of the recess 60. In contrast, in a fifth embodiment, the outer bead lateral surface 56b extends along the sloped surface 68. The configuration, the operation and the effect not specifically described in the fifth embodiment are the same as those in the first to fourth embodiments. In the fifth embodiment, points, which are different from the fourth embodiment, will be mainly described.

Figure 13:
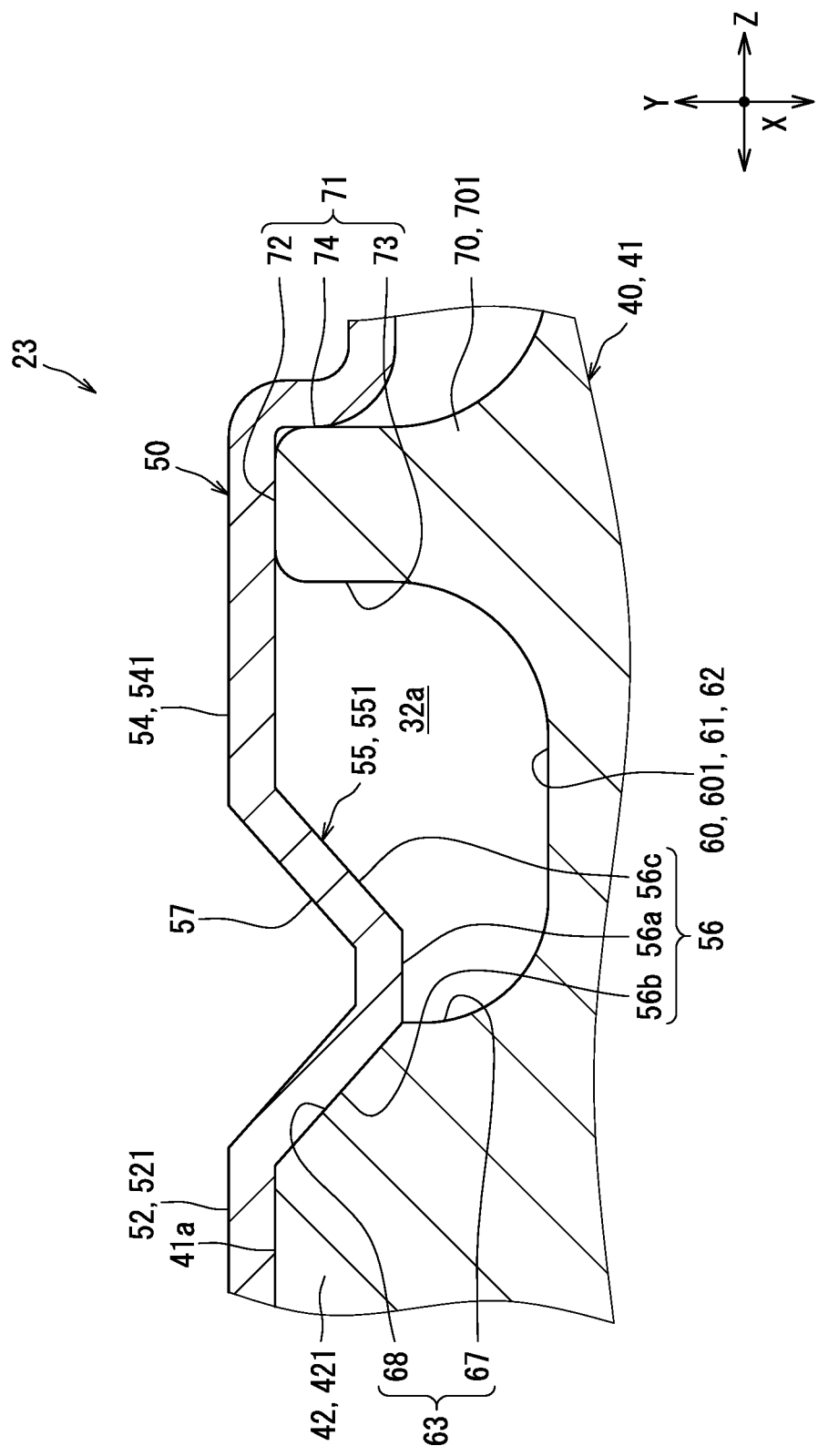
FIG. 13 is an enlarged view around an upstream wall-side bead of a fifth embodiment.

As shown in FIG. 13, the vertical cross-section of the wall-side bead 551, 552 is not shaped in the curved form but is shaped in a linear form (polygonal line form) as a whole. The wall-side bead 551, 552 does not have the curved portions 58a-58d unlike the fourth embodiment. In the wall-side bead 551, 552, the bead distal end surface 56a and the outer bead lateral surface 56b are directly joined with each other while the distal end curved portion 58a placed on the outer peripheral side is not interposed between the bead distal end surface 56a and the outer bead lateral surface 56b. The outer bead lateral surface 56b and the outer joint plate portion 52 are directly connected with each other while the base end curved portion 58c placed on the outer peripheral side is not interposed between the outer bead lateral surface 56b and the outer joint plate portion 52. The bead distal end surface 56a and the inner bead lateral surface 56c are directly joined with each other while the distal end curved portion 58b placed on the inner peripheral side is not interposed between the bead distal end surface 56a and the inner bead lateral surface 56c. The inner bead lateral surface 56c and the passage plate portion 54 are directly joined with each other while the base end curved portion 58d placed on the inner peripheral side is not interposed between the inner bead lateral surface 56c and the passage plate portion 54.

In the wall-side bead 551, 552, the outer bead lateral surface 56b and the inner bead lateral surface 56c are tilted relative to the depth direction of the recess 60. The outer bead lateral surface 56b extends along the sloped surface 68 of the outer recess wall surface 63. The tilt angle of the outer bead lateral surface 56b and the tilt angle of the sloped surface 68 relative to the depth direction of the recess 60 are substantially identical to each other. The outer bead lateral surface 56b and the sloped surface 68 extend parallel to each other and are opposed to each other.

When the wall-side bead 551, 552 contacts the outer recess wall surface 63, the outer bead lateral surface 56b and the sloped surface 68 contact with each other such that the outer bead lateral surface 56b and the sloped surface 68 overlap with each other. When the outer bead lateral surface 56b and the sloped surface 68 make surface-to-surface contact with each other, a contact surface area between the wall-side bead 551, 552 and the outer recess wall surface 63 is increased. Therefore, by extending the outer bead lateral surface 56b along the sloped surface 68, the concentration of the stress at the part of the contact portion between the wall-side bead 551, 552 and the outer recess wall surface 63 is limited.

Sixth Embodiment

In a sixth embodiment, the inner fin lateral surface 74 of the fin 70 has a sloped surface 78. The configuration, the operation and the effect not specifically described in the sixth embodiment are the same as those in the first to third embodiments. In the sixth embodiment, points, which are different from the third embodiment, will be mainly described.

Figure 14:
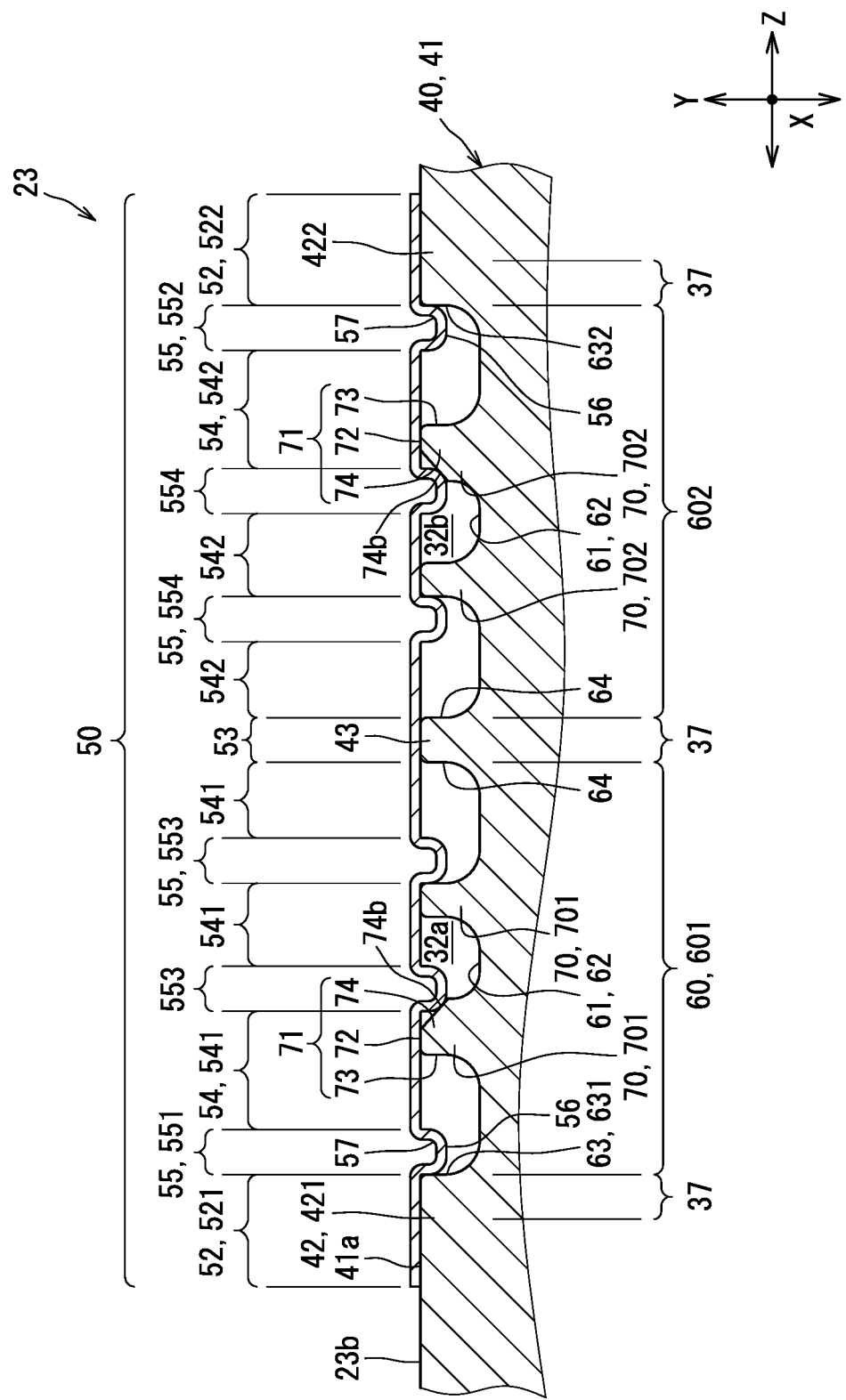
FIG. 14 is a vertical cross-sectional view of a floor passage of a sixth embodiment.
Figure 15:
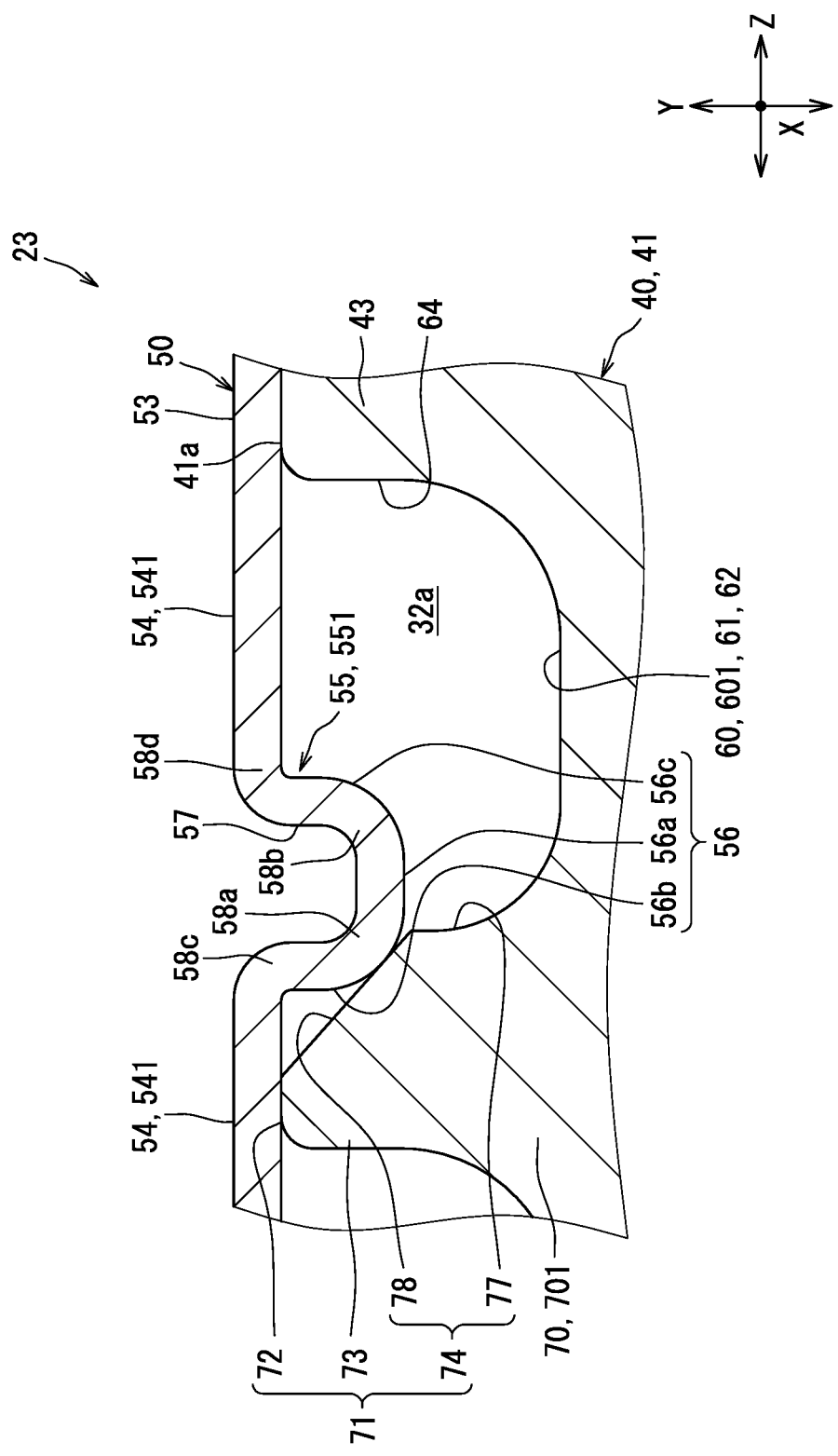
FIG. 15 is an enlarged view around an upstream fin-side bead shown in FIG. 14.

As shown in FIGS. 14 and 15, the inner fin lateral surface 74 of the fin 70 has a rising surface 77 and the sloped surface 78. The rising surface 77 forms an end portion of the inner fin lateral surface 74 which is adjacent to the recess bottom surface 62. The rising surface 77 extends in the depth direction of the recess 60 that is also the intersecting direction which intersects the lower cover 50. The sloped surface 78 is located on a side of the rising surface 77, which is opposite to the recess bottom surface 62 in the depth direction of the recess 60, and the sloped surface 78 forms an end surface of the inner fin lateral surface 74, which is adjacent to the fin distal end surface 72. The sloped surface 78 extends in a direction that is tilted relative to both the rising surface 77 and the fin distal end surface 72, and the sloped surface 78 joins between the rising surface 77 and the fin distal end surface 72. A degree of tilt of the sloped surface 78 relative to the depth direction of the recess 60 is larger than a degree of tilt of the rising surface 77 relative to the depth direction of the recess 60. The vertical cross-section of the fin 70 is shaped such that a convex corner between the inner fin lateral surface 74 and the fin distal end surface 72 is cut out by the sloped surface 78.

The beads 55 at each of the upstream passage 32a and the downstream passage 32b include the bead 55 that is placed at a position, at which the bead 55 comes in contact with the sloped surface 78 of the inner fin lateral surface 74. For example, each of the upstream fin-side bead 553 and the downstream fin-side bead 554 is placed at a position, at which the bead 553, 554 comes in contact with the sloped surface 78 of the inner fin lateral surface 74.

The fin-side bead 553, 554 is located closer to the sloped surface 78 than the rising surface 77 in the depth direction of the recess 60. The fin-side bead 553, 554 and the rising surface 77 are arranged one after the other in the depth direction of the recess 60. The fin-side bead 553, 554 and the sloped surface 78 are arranged side by side in the width direction of the floor passage 32. At least a portion of the bead outer surface 56 of the fin-side bead 553, 554 contacts the sloped surface 78. In the fin-side bead 553, 554, the distal end curved portion 58a, which is placed on the outer peripheral side, is closest to the sloped surface 78 and is most likely to contact the sloped surface 78.

The sloped surface 78 is tilted such that the sloped surface 78 extends along the distal end curved portion 58a which is placed on the outer peripheral side. Therefore, when the distal end curved portion 58a, which is placed on the outer peripheral side, contacts the sloped surface 78, a contact surface area between the fin-side bead 553, 554 and the inner fin lateral surface 74 tends to be increased. Therefore, the concentration of the stress at the part of the contact portion between the bead 55 and the inner fin lateral surface 74 is limited by the contact between the distal end curved portion 58a, which is placed on the outer peripheral side, and the sloped surface 78. The sloped surface 78 is tilted relative to the outer bead lateral surface 56b and the inner bead lateral surface 56c of the fin-side bead 553, 554.

According to the present embodiment, at the inner fin lateral surface 74, the sloped surface 78, to which the fin-side bead 553, 554 comes in contact, is tilted relative to the depth direction of the recess 60. Therefore, even when the position of the fin-side bead 553, 554 relative to the inner fin lateral surface 74 is slightly deviated in the width direction of the floor passage 32 due to, for example, a manufacturing error, the fin-side bead 553, 554 can easily come in contact with the sloped surface 78 of the inner fin lateral surface 74.

In the case where the lower cover 50 is resiliently deformed due to, for example, the internal pressure increase in the floor passage 32, the fin-side bead 553, 554 may possibly tilt such that the opening of the bead inner surface 57 faces the inner fin lateral surface 74 side. In this case, when the tilt angle of the outer bead lateral surface 56b approaches the tilt angle of the sloped surface 78, the outer bead lateral surface 56b of the fin-side bead 553, 554 easily comes in contact with the sloped surface 78. As for the lower cover 50, the contact surface area between the fin-side bead 553, 554 and the inner fin lateral surface 74 tends to be increased regardless of which one of the distal end curved portion 58a placed on the outer peripheral side and the outer bead lateral surface 56b contacts the sloped surface 78. Therefore, the concentration of the stress at the part of the contact portion between the bead 55 and the inner fin lateral surface 74 can be further limited by the sloped surface 78 even when the lower cover 50 is deformed.

Seventh Embodiment

In the sixth embodiment described above, the outer bead lateral surface 56b of the bead 55 is tilted relative to the sloped surface 78 of the fin 70. In contrast, in a seventh embodiment, the outer bead lateral surface 56b extends along the sloped surface 78. The configuration, the operation and the effect not specifically described in the seventh embodiment are the same as those in the first to third and sixth embodiments. In the seventh embodiment, points, which are different from the sixth embodiment, will be mainly described.

Figure 16:
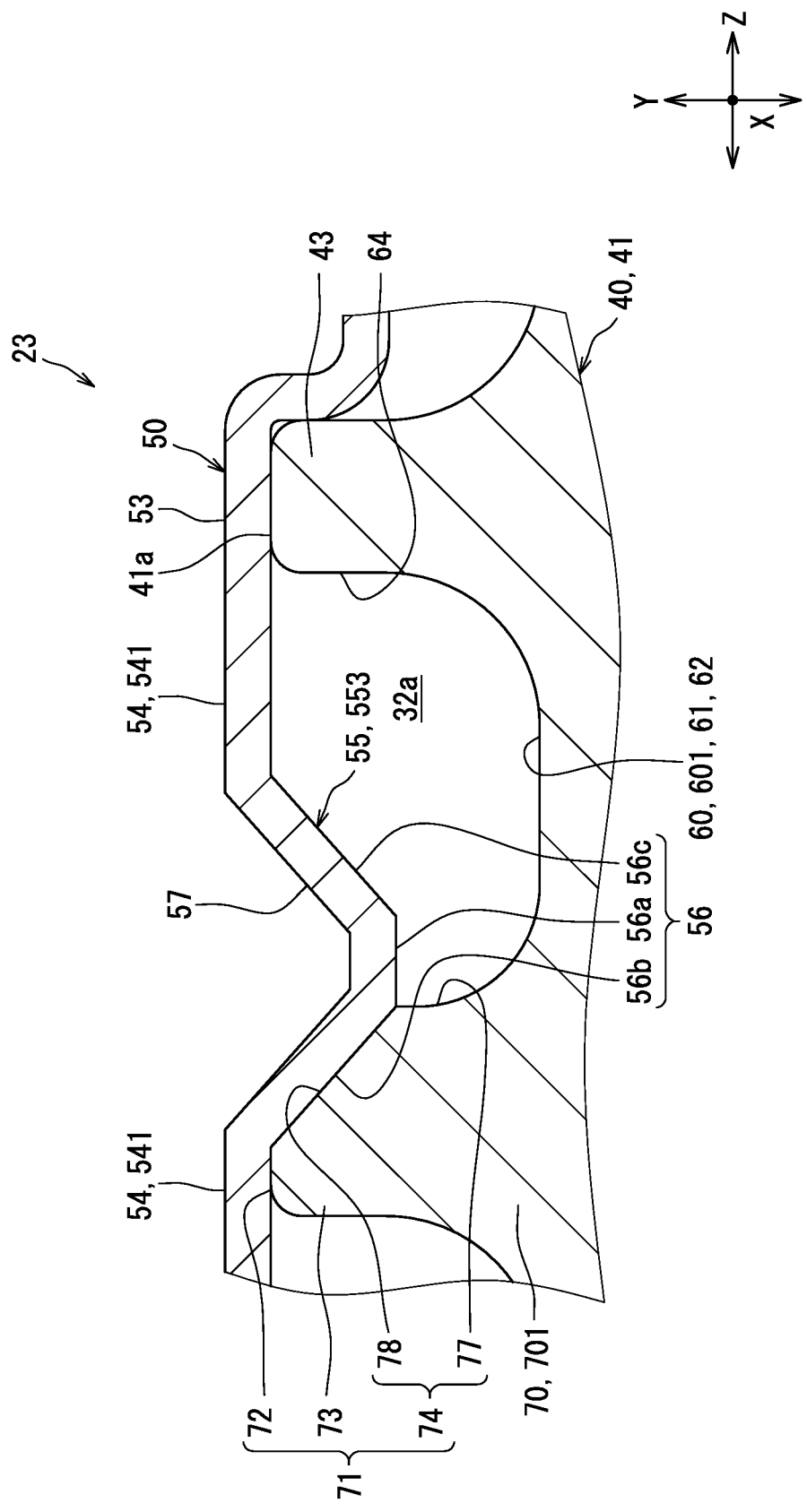
FIG. 16 is an enlarged view around an upstream fin-side bead of a seventh embodiment.

In the present embodiment, as shown in FIG. 16, the shape of the fin-side bead 553, 554 is substantially the same as the shape of the wall-side bead 551, 552 of the fifth embodiment. The fin-side beads 553, 554 is not shaped in the curved form but is shaped in a linear form (polygonal line form) as a whole. The fin-side bead 553, 554 does not have the curved portions 58a-58d like the wall-side bead 551, 552 of the fifth embodiment.

In the fin-side bead 553, 554, the outer bead lateral surface 56b and the inner bead lateral surface 56c are tilted relative to the depth direction of the recess 60. The outer bead lateral surface 56b extends along the sloped surface 78 of the inner fin lateral surface 74. The tilt angle of the outer bead lateral surface 56b and the tilt angle of the sloped surface 78 relative to the depth direction of the recess 60 are substantially identical to each other. The outer bead lateral surface 56b and the sloped surface 78 extend parallel to each other and are opposed to each other.

When the fin-side bead 553, 554 contacts the inner fin lateral surface 74, the outer bead lateral surface 56b and the sloped surface 78 contact with each other such that the outer bead lateral surface 56b and the sloped surface 78 overlap with each other. When the outer bead lateral surface 56b and the sloped surface 78 make surface-to-surface contact with each other, a contact surface area between the fin-side bead 553, 554 and the inner fin lateral surface 74 is increased. Therefore, by extending the outer bead lateral surface 56b along the sloped surface 78, the concentration of the stress at the part of the contact portion between the fin-side bead 553, 554 and the inner fin lateral surface 74 is limited.

Eighth Embodiment

In the first to third embodiments, the outer bead lateral surface 56b of each of the beads 55 contacts the outer recess wall surface 63 or the inner fin lateral surface 74. In contrast, in an eighth embodiment, the inner bead lateral surface 56c of each of the beads 55 contacts the inner recess wall surface 64 or the outer fin lateral surface 73. The configuration, the operation and the effect not specifically described in the eighth embodiment are the same as those in the first to third embodiments. In the eighth embodiment, points, which are different from the first to third embodiments, will be mainly described.

Figure 17:
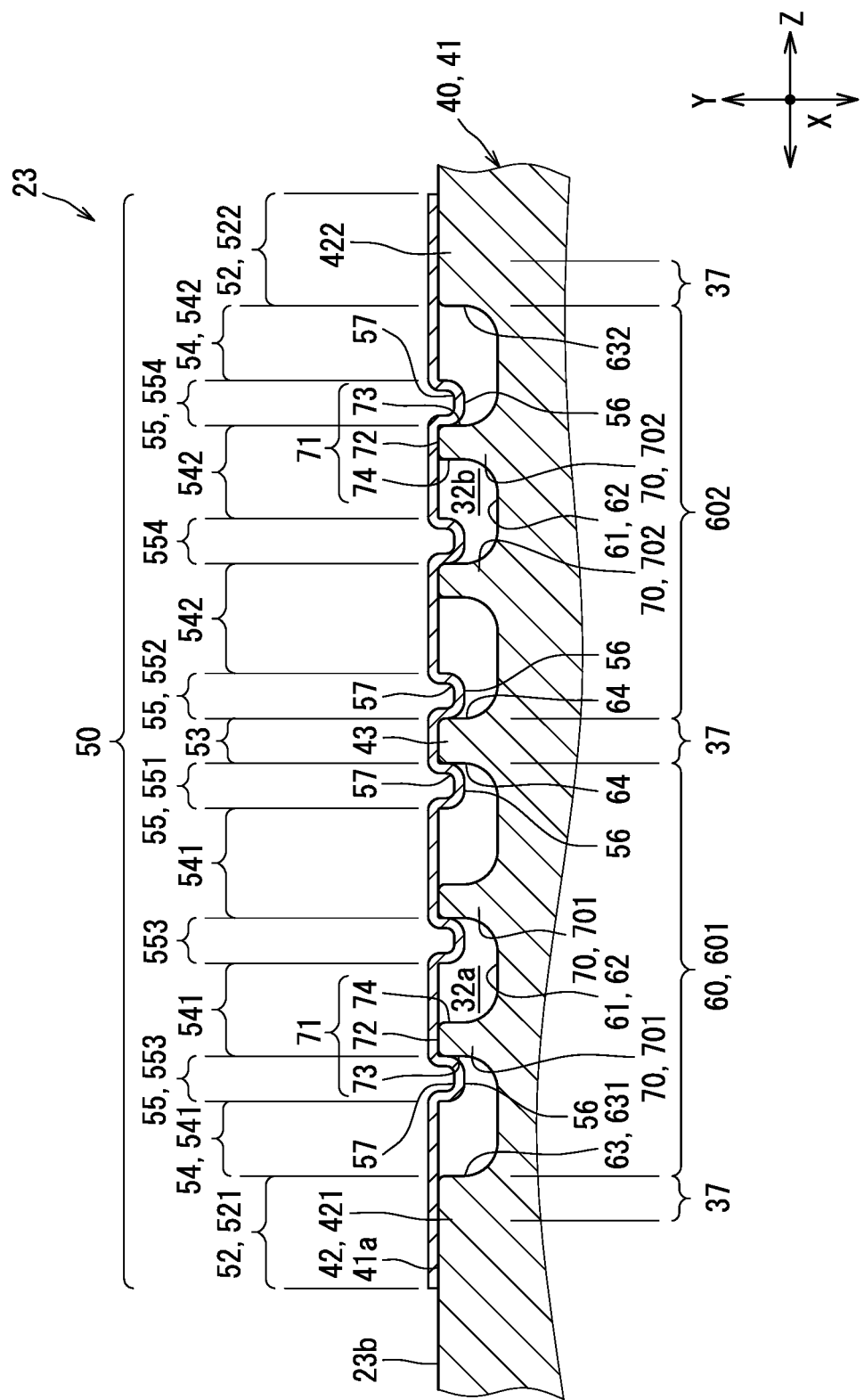
FIG. 17 is a vertical cross-sectional view of a floor passage of an eighth embodiment.

As shown in FIG. 17, each of the wall-side beads 551, 552 is placed at a position, at which the wall-side bead 551, 552 comes in contact with the inner recess wall surface 64 of the recess 60. In the width direction of the floor passage 32, each of the wall-side beads 551, 552 is provided between: an innermost one of the fins 70, which is innermost on the inner peripheral side; and the inner floor wall portion 43. The inner bead lateral surface 56c of the wall-side bead 551, 552 and the inner recess wall surface 64 are opposed to each other and contact with each other. The outer bead lateral surface 56b of the wall-side bead 551, 552 and the outer fin lateral surface 73 of the fin 70, which is placed next to the wall-side bead 551, 552, are opposed to each other and are spaced from each other in the width direction of the floor passage 32. The inner recess wall surface 64 serves as an intersecting surface and a peripheral wall surface.

In the present embodiment, by contacting the wall-side bead 551, 552 to the inner recess wall surface 64, the stress, which is generated due to the internal pressure increase in the floor passage 32, urges the wall-side bead 551, 552 against the inner recess wall surface 64 and is thereby applied to the inner recess wall surface 64 through the wall-side bead 551, 552. As discussed above, by applying the stress from the lower cover 50 to the inner recess wall surface 64, the concentration of the stress at the part of the lower cover 50, such as the inner peripheral end of the joint 37, is less likely to occur. Therefore, like in the configurations of the first and third embodiments, in which each of the wall-side beads 551, 552 contacts the outer recess wall surface 63, the localized deformation of the lower cover 50 caused by the concentration of the stress at the part of the lower cover 50 is limited, and thereby the plastic deformation of the lower cover 50 caused by the localized deformation of the lower cover 50 is limited.

Among the wall-side beads 551, 552, the wall-side bead (hereinafter referred to as an upstream wall-side bead) 551 is placed at a position, at which the upstream wall-side bead 551 comes in contact with the inner recess wall surface 64 of the upstream recess portion 601. The upstream wall-side bead 551 is located between and joins between the inner joint plate portion 53 and the upstream passage plate portion 541 in the width direction of the upstream passage 32a. The wall-side bead (hereinafter referred to as a downstream wall-side bead) 552 is placed at a position, at which the downstream wall-side bead 552 comes in contact with the inner recess wall surface 64 of the downstream recess portion 602. The downstream wall-side bead 552 is located between and joins between the inner joint plate portion 53 and the downstream passage plate portion 542 in the width direction of the downstream passage 32b.

Each of the fin-side beads 553, 554 is placed at a position, at which the fin-side bead 553, 554 comes in contact with the outer fin lateral surface 73 of the corresponding fin 70. The fin-side beads 553, 554 are arranged side by side in the width direction of the floor passage 32. The fin-side beads 553, 554 include the fin-side bead 553, 554, which is placed between the outermost one of the fins 70 placed outermost on the outer peripheral side, and the outer recess wall surface 63. Also, the fin-side beads 553, 554 include the fin-side bead 553, 554, which is placed between the adjacent two fins 70. The inner bead lateral surface 56c of each of the fin-side beads 553, 554 is opposed to and contacts the outer fin lateral surface 73 of the corresponding fin 70. The outer bead lateral surface 56b of each of the fin-side beads 553, 554 is opposed to the outer recess wall surface 63 or the inner fin lateral surface 74 of the next fin 70 and is spaced from the outer recess wall surface 63 or the inner fin lateral surface 74 of the next fin 70 in the width direction of the floor passage 32. The outer fin lateral surface 73 serves as an intersecting surface and a fin lateral surface.

In the present embodiment, by contacting the fin-side bead 553, 554 to the outer fin lateral surface 73, the stress, which is generated due to the internal pressure increase in the floor passage 32, urges the fin-side bead 553, 554 against the outer fin lateral surface 73. This stress is applied to the outer fin lateral surface 73 through the fin-side bead 553, 554. As discussed above, by applying the stress from the lower cover 50 to the outer fin lateral surface 73, the concentration of the stress at the part of the lower cover 50, such as the inner peripheral end of the joint 37, is less likely to occur. Therefore, like in the configurations of the second and third embodiments, in which each of the fin-side bead 553, 554 contacts the corresponding inner fin lateral surface 74, the localized deformation of the lower cover 50 caused by the concentration of the stress at the part of the lower cover 50 is limited, and thereby the plastic deformation of the lower cover 50 caused by the localized deformation of the lower cover 50 is limited.

Among the fin-side beads 553, 554, each of the upstream fin-side beads 553 is placed at the corresponding position, at which the upstream fin-side bead 553 comes in contact with the outer fin lateral surface 73 of the corresponding upstream fin 701. Each of downstream fin-side beads 554 is placed at the corresponding position, at which the downstream fin-side bead 554 comes in contact with the outer fin lateral surface 73 of the corresponding downstream fin 702.

Next, the manufacturing method of the case 20 of the eighth embodiment will be described. When the lower cover 50 is temporarily assembled to the case main body 40 at the temporarily assembling step, the inner floor wall portion 43 is fitted between the upstream wall-side bead 551 and the downstream wall-side bead 552. Furthermore, in this case, the upstream fin 701 and the downstream fin 702 are fitted between the upstream fin-side bead 553 and the downstream fin-side bead 554. In this state, by contacting the wall-side bead 551, 552 to the inner recess wall surface 64, or by contacting the fin-side bead 553, 554 to the outer fin lateral surface 73, a positional deviation of the lower cover 50 relative to the case main body 40 in the Z direction is limited.

In the case where the joining operation is performed after the temporarily assembling step, each of the wall-side beads 551, 552 is in contact with the inner recess wall surface 64, and each of the fin-side beads 553, 554 is in contact with the outer fin lateral surface 73 of the corresponding fin 70. For this reason, the stress, which is generated by, for example, the linear expansion of the lower cover 50, is applied from the wall-side bead 551, 552 to the inner recess wall surface 64 and is applied from the fin-side bead 553, 554 to the outer fin lateral surface 73 in the same way as in the completed electric power converter apparatus 10. Therefore, the plastic deformation of the lower cover 50 is limited.

According to the present embodiment, each wall-side bead 551, 552, which extends in the intersecting direction that intersects the passage plate portion 54, comes in contact with the inner recess wall surface 64, which extends in the intersecting direction that intersects the passage plate portion 54. Therefore, even when the stress is generated due to, for example, the internal pressure increase in the floor passage 32 and/or the linear expansion of the lower cover 50, this stress is applied from the wall-side bead 551, 552 to the inner recess wall surface 64. Therefore, the plastic deformation of the lower cover 50 can be limited by the wall-side beads 551, 552.

According to the present embodiment, each of the wall-side beads 551, 552 is in contact with the inner recess wall surface 64. Therefore, even when the stress is generated due to, for example, the internal pressure increase in the floor passage 32, this stress is applied from the wall-side bead 551, 552 to the inner recess wall surface 64 without waiting for the resilient deformation of the lower cover 50 caused by this stress. Thus, the stress can be more reliably applied from the lower cover 50 to the inner recess wall surface 64. Therefore, like in the first embodiment, the concentration of the stress at the part of the lower cover 50 can be more reliably limited.

According to the present embodiment, the inner recess wall surface 64, which is in contact with the wall-side beads 551, 552, forms the peripheral edge portion of the floor passage 32. In this configuration, the stress, which is applied from the wall-side bead 551, 552 to the inner recess wall surface 64, is applied to the inner floor wall portion 43, which forms the inner recess wall surface 64. The inner floor wall portion 43 is stronger than, for example, the fin 70. This is due to the fact that a volume of the inner floor wall portion 43 is larger than that of the fin 70, and the inner floor wall portion 43 forms the main body lower surface 41a. Therefore, even when the stress is applied from the wall-side bead 551, 552 to the inner recess wall surface 64, this stress hardly causes the deformation of the inner floor wall portion 43. Therefore, the floor passage 32, which is formed by the inner floor wall portion 43, can be kept in the appropriate state.

According to the present embodiment, since the inner bead lateral surface 56c of each wall-side bead 551, 552 comes in contact with the inner recess wall surface 64, the contact surface area between the wall-side bead 551, 552 and the outer bead lateral surface 56b tends to increase. Therefore, the stress is less likely to be concentrated at a part of the contact portion between the wall-side bead 551, 552 and the inner recess wall surface 64. Thus, it is possible to limit the occurrence of the plastic deformation of the wall-side bead 551, 552 caused by localized deformation of the contact portion of the wall-side bead 551, 552 which is in contact with the inner recess wall surface 64.

According to the present embodiment, each fin-side bead 553, 554, which extends in the intersecting direction that intersects the passage plate portion 54, comes in contact with the outer fin lateral surface 73 of the corresponding fin 70, which extends in the intersecting direction that intersects the passage plate portion 54. Therefore, even when the stress is generated due to, for example, the internal pressure increase in the floor passage 32 and/or the linear expansion of the lower cover 50, this stress is applied from the fin-side bead 553, 554 to the outer fin lateral surface 73. Therefore, like in the second embodiment, the plastic deformation of the lower cover 50 can be limited.

According to the present embodiment, each of the fin-side beads 553, 554 is in contact with the outer fin lateral surface 73 of the corresponding fin 70. Therefore, even when the stress is generated due to, for example, the internal pressure increase in the floor passage 32, this stress is applied from the fin-side bead 553, 554 to the outer fin lateral surface 73 without waiting for the resilient deformation of the lower cover 50 caused by this stress. Thus, the stress can be more reliably applied from the lower cover 50 to the outer fin lateral surface 73. Therefore, like in the second embodiment, the concentration of the stress at the part of the lower cover 50 can be more reliably limited.

According to the present embodiment, the outer fin lateral surface 73 is included in the fin outer surface 71 of the fin 70. According to this configuration, the stress, which is applied from the fin-side bead 553, 554 to the outer fin lateral surface 73, is applied to the fin 70. Therefore, like in the second embodiment, the fin 70 can enhance the cooling effect with the refrigerant by increasing the contact surface area between the recess inner surface 61 of the recess 60 and the refrigerant in the floor passage 32 and can limit the localized deformation of the lower cover 50.

According to the present embodiment, since the inner bead lateral surface 56c of each fin-side bead 553, 554 comes in contact with the outer fin lateral surface 73 of the corresponding fin 70, the contact surface area between the fin-side bead 553, 554 and the fin 70 tends to be increased. Therefore, the stress is less likely to be concentrated at a part of the contact portion between the fin-side bead 553, 554 and the outer fin lateral surface 73. Thus, like in the second embodiment, it is possible to limit the occurrence of the plastic deformation of the fin-side bead 553, 554 caused by localized deformation of the contact portion of the fin-side bead 553, 554 which is in contact with the fin 70.

As discussed in the fourth and sixth embodiments, in the case where the lower cover 50 is resiliently deformed due to, for example, the internal pressure increase in the floor passage 32, the wall-side bead 551, 552 or the fin-side bead 553, 554 may possibly tilt such that the opening of the bead inner surface 57 faces the outer recess wall surface 63 side. In the present embodiment, when the wall-side bead 551, 552 is tilted, the inner bead lateral surface 56c of the wall-side bead 551, 552 or the distal end curved portion 58b of the wall-side bead 551, 552 placed on the inner peripheral side tends to be urged against the inner recess wall surface 64. Therefore, it is possible to implement the configuration that makes the reliable contact of the wall-side bead 551, 552 to the inner recess wall surface 64. Similarly, when the fin-side bead 553, 554 is tilted, the inner bead lateral surface 56c of the fin-side bead 553, 554 or the distal end curved portion 58b of the fin-side bead 553, 554 placed on the inner peripheral side tends to be urged against the outer fin lateral surface 73. Therefore, it is possible to implement the configuration that makes the reliable contact of the fin-side bead 553, 554 to the outer fin lateral surface 73.

Ninth Embodiment

In the first embodiment discussed above, the wall-side bead 551, 552 is placed at the position, at which the wall-side bead 551, 552 comes in contact with the outer recess wall surface 63. In the eighth embodiment discussed above, each of the wall-side beads 551, 552 is placed at the position, at which the wall-side bead 551, 552 comes in contact with the inner recess wall surface 64. In contrast, in a ninth embodiment, each of the wall-side beads 551, 552 is placed at a corresponding one of: a position, at which the wall-side bead 551, 552 comes in contact with the outer recess wall surface 63; and a position, at which the wall-side bead 551, 552 comes in contact with the inner recess wall surface 64. The configuration, the operation and the effect not specifically described in the ninth embodiment are the same as those in the first and eighth embodiments. In the ninth embodiment, points, which are different from the first and eighth embodiments, will be mainly described.

Figure 18:
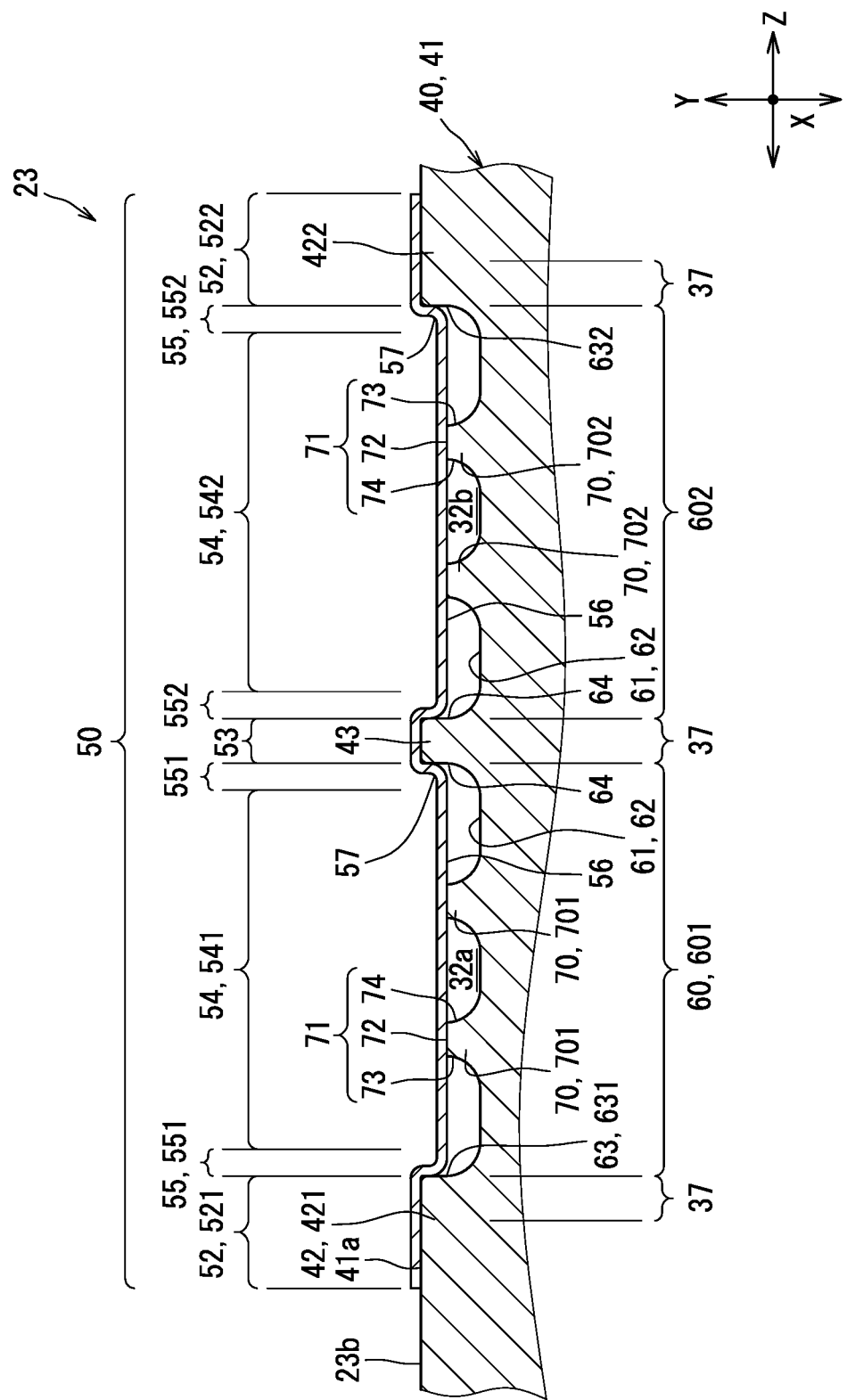
FIG. 18 is a vertical cross-sectional view of a floor passage of a ninth embodiment.

As shown in FIG. 18, the wall-side beads 551, 552 are arranged side by side in the width direction of the floor passage 32. In the present embodiment, two wall-side beads 551 and two wall-side beads 552 are arranged side by side in the width direction of the floor passage 32. The passage plate portion 54 is placed between the two wall-side beads 551 and is also placed between the two wall-side beads 552. The passage plate portion 54 joins between the two wall-side beads 551 and also joins between the two wall-side beads 552. Among the wall-side beads 551, 552, each of the wall-side beads 551, 552, which are placed on the outer peripheral side, is placed at a position, at which the wall-side bead 551, 552 comes in contact with the outer recess wall surface 63. Each of the wall-side beads 551, 552, which are placed on the inner peripheral side, is placed at a position, at which the wall-side bead 551, 552 comes in contact with the inner recess wall surface 64.

In the upstream passage 32a, the upstream passage plate portion 541 is placed between and joins between the two upstream wall-side beads 551. Among the two upstream wall-side beads 551, the upstream wall-side bead 551, which is placed on the outer peripheral side, contacts the outer recess wall surface 63, and the other upstream wall-side bead 551, which is placed on the inner peripheral side, contacts the inner recess wall surface 64.

In the downstream passage 32b, the downstream passage plate portion 542 is placed between and joins between the two downstream wall-side beads 552. Among the two downstream wall-side beads 552, the downstream wall-side bead 552, which is placed on the outer peripheral side, contacts the outer recess wall surface 63, and the other downstream wall-side bead 552, which is placed on the inner peripheral side, contacts the inner recess wall surface 64.

The height of the passage plate portion 54 in the depth direction of the recess 60 is different from the height of the joint plate portions 52, 53 in the depth direction of the recess 60. In the present embodiment, the passage plate portion 54 is located closer to the recess bottom surface 62 than the joint plate portions 52, 53 in the depth direction of the recess 60. The height dimension of each fin 70 in the depth direction of the recess 60 is smaller than the depth dimension of the recess 60 in the depth direction of the recess 60, i.e., is smaller than the height dimension of the inner floor wall portion 43 and the outer floor wall portion 42 in the depth direction of the recess 60. Like in the first embodiment, the passage plate portion 54 overlaps with the fin distal end surface 72 of each fin 70.

Each of the wall-side beads 551, 552 extends in the depth direction of the recess 60 such that the wall-side bead 551, 552 extends to join between the corresponding joint plate portion 52, 53 and the passage plate portion 54. Each of the wall-side beads 551, 552 extends from the passage plate portion 54 toward the side, which is opposite to the recess bottom surface 62, and each of the wall-side beads 551, 552 also extends from the corresponding joint plate portion 52, 53 toward the recess bottom surface 62.

Each of the wall-side beads 551, 552 is shaped in a curved form as a whole. Each of the wall-side beads 551, 552 placed on the outer peripheral side is shaped in a form that is formed by: the outer bead lateral surface 56b of the wall-side bead 551, 552; the distal end curved portion 58a placed on the outer peripheral side; and the base end curved portion 58c placed on the outer peripheral side among the wall-side beads 551, 552 of the first embodiment. Each of the wall-side beads 551, 552 placed on the inner peripheral side is shaped in a form that is formed by: the inner bead lateral surface 56c of the wall-side bead 551, 552; the distal end curved portion 58b placed on the inner peripheral side; and the base end curved portion 58d placed on the inner peripheral side among the wall-side beads 551, 552 of the first embodiment.

Next, the manufacturing method of the case 20 of the ninth embodiment will be described. When the lower cover 50 is temporarily assembled to the case main body 40 at the temporarily assembling step, the wall-side beads 551, 552 along with the passage plate portion 54 are fitted between the outer recess wall surface 63 and the inner recess wall surface 64 of the recess 60. In this case, by contacting each of the wall-side beads 551, 552 to the corresponding recess wall surface 63, 64, a positional deviation of the lower cover 50 relative to the case main body 40 in the Z direction is limited.

Tenth Embodiment

In the first and eighth embodiments discussed above, the bead (more specifically, the wall-side bead) 55 is placed at the corresponding position, at which the bead 55 comes in contact with the corresponding recess wall surfaces 63, 64. In the second and eighth embodiments discussed above, the bead (more specifically, the fin-side bead) 55 is placed at the corresponding position, at which the bead 55 comes in contact with the fin lateral surface 73, 74. In contrast, in a tenth embodiment, each bead 55 is placed at a position, at which the bead 55 is spaced from all of the recess wall surfaces 63, 64 and the fin lateral surfaces 73, 74. The configuration, the operation and the effect not specifically described in the tenth embodiment are the same as those in the first, second and eighth embodiments. In the tenth embodiment, points, which are different from the first embodiment, will be mainly described.

Figure 19:
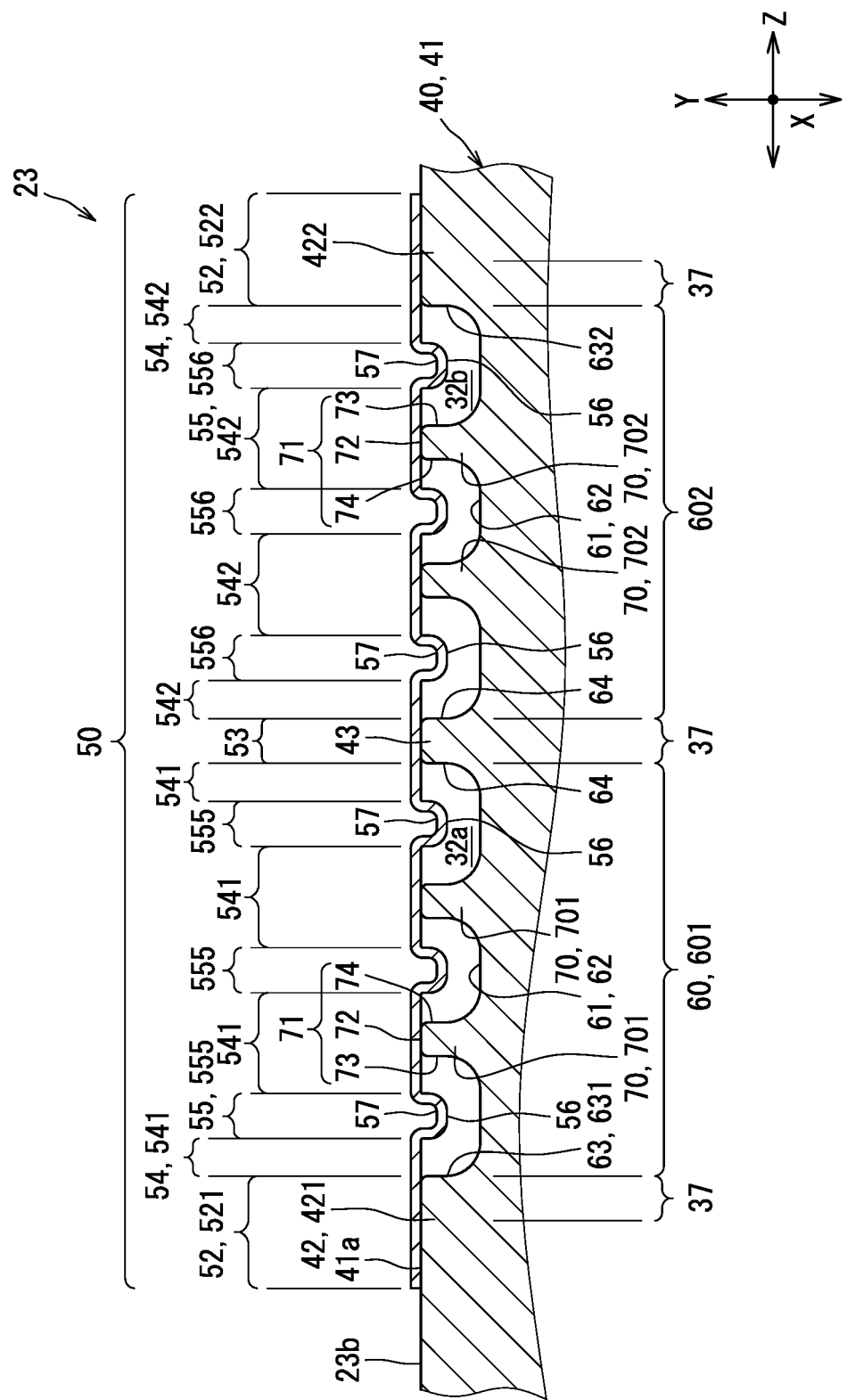
FIG. 19 is a vertical cross-sectional view of a floor passage of a tenth embodiment.

In the present embodiment, as shown in FIG. 19, each of the beads 55 is not placed at: the position, at which the bead 55 comes in contact with the recess wall surface 63, 64; or the position, at which the bead 55 comes in contact with the fin lateral surface 73, 74. Each of the beads 55 is placed at a corresponding position, at which the bead 55 is spaced from the recess wall surfaces 63, 64 and the fin lateral surfaces 73, 74 in the width direction of the floor passage 32. That is, each of the beads 55 is placed at the corresponding position, at which the bead 55 does not contact the recess wall surfaces 63, 64 and the fin lateral surfaces 73, 74.

The bead 55, which does not contact any of the recess wall surfaces 63, 64 and the fin lateral surfaces 73, 74, will be also referred to as a contactless bead 555, 556. Among the contactless beads 555, 556, the beads (hereinafter referred to as upstream contactless beads) 555 are placed at the upstream passage 32a, and the beads (hereinafter referred to as downstream contactless beads) 556 are placed at the downstream passage 32b. Each of the contactless beads 555, 556 serves as a connection portion and a contactless connection portion.

The contactless beads 555, 556 are arranged side by side in the width direction of the floor passage 32. Each of the fins 70 is placed between corresponding adjacent two of the contactless beads 555, 556 in the width direction of the floor passage 32. Each of the contactless beads 555, 556 is not directly joined to any of the joint plate portions 52, 53 but is indirectly connected to the joint plate portions 52, 53 through the passage plate portion 54. Each adjacent two of the contactless beads 555, 556, which are adjacent to each other in the width direction of the floor passage 32, are connected to each other through the passage plate portion 54. As discussed with respect to the beads 55 in the first embodiment, each of the contactless beads 555, 556 is shaped in the curved form as a whole.

According to the present embodiment, even when the stress is generated due to, for example, the internal pressure increase in the floor passage 32 and/or the linear expansion of the lower cover 50, the contactless bead 555, 556 can be easily deformed by this stress. As discussed above, by applying the stress to the contactless beads 555, 556, the concentration of the stress at the part of the lower cover 50, such as the inner peripheral end of the joint 37, is less likely to occur. Thus, the localized deformation of the joint plate portion 52, 53 or the passage plate portion 54 by the concentration of the stress at a part of the joint plate portion 52, 53 or a part of the passage plate portion 54 is limited, and thereby the plastic deformation of the joint plate portion 52, 53 or the passage plate portion 54 caused by the localized deformation thereof is limited.

According to the present embodiment, since each of the contactless beads 555, 556 is curved, the entire contactless bead 555, 556 is easily resiliently deformed. Therefore, in the case where the stress is applied to each of the contactless beads 555, 556, the entire contactless bead 555, 556 is resiliently deformed. Thus, the concentration of the stress at a part of the contactless bead 555, 556 is less likely to occur. Thus, the plastic deformation of the contactless bead 555, 556 caused by the localized deformation thereof is limited.

Other Embodiments

The disclosure of the present application is not limited to the illustrated embodiments. The disclosure encompasses the illustrated embodiments and variations, which are conceivable by those skilled in the art based on the illustrated embodiment(s). For example, the disclosure is not limited to the combination of the components and elements indicated in the embodiments, but can be implemented in various variations. Then disclosure can be implemented in a variety of combinations. The disclosure may have additional parts that can be added to the embodiment(s). The disclosure includes variations, in which some of the components and/or elements of the embodiment(s) is/are omitted. The disclosure encompasses the replacement or combination of the components and/or elements between one of the embodiments and another one or more of the embodiments. The disclosed technical scope is not limited to the technical scope described in the embodiment(s). Some disclosed technical scope should include the technical scope indicated by the statement of claim(s) and all of equivalents to the technical scope indicated by the statement of claim(s).

In each of the above embodiments, each of the beads 55 may extend from the passage plate portion 54 or the joint plate portion 52, 53 toward the inside of the recess 60 or toward the side opposite to the recess 60 as long as the bead 55 extends in the intersecting direction that intersects the passage plate portion 54. For example, in the first embodiment, each of the beads 55 may project from the lower cover 50 toward the side opposite to the recess 60. Furthermore, in the ninth embodiment, each of the beads 55 may project from the passage plate portion 54 toward the recess 60 or may project from the joint plate portion 52, 53 toward the side opposite to the recess 60.

However, in order to realize the configuration, in which the bead 55 contacts the recess wall surface 63, 64 or the fin lateral surface 73, 74, it is preferable that the bead 55 extends from at least one of the joint plate portions 52, 53 and the passage plate portion 54 toward the recess 60. For example, when the bead outer surface 56 extends toward the recess 60, it is possible to realize the configuration, in which the bead 55 contacts the recess wall surface 63, 64 or the fin lateral surface 73, 74. In this configuration, the bead 55 may not have the bead inner surface 57 and may project toward the recess 60 and also the side opposite to the recess 60.

In each of the above embodiments, each of the beads 55 may not be curved as long as the bead 55 extends in the intersecting direction that intersects the passage plate portion 54. For example, as in the fifth or seventh embodiment, the vertical cross-section of the bead 55 may be shaped in the linear form (polygonal line form). Furthermore, the bead 55 may have at least a partially curved form in its vertical cross-section. For example, in the first embodiment, if the bead 55 has at least one of the distal end curved portions 58*a*, 58*b* and the base end curved portions 58*c*, 58*d*, the bead 55 will have at least a partially curved form in its vertical cross-section.

In each of the embodiments, each of the beads 55 may have a flat form, which is flattened in the vertical direction, rather than the flat form, which is widely flattened in the width direction. For example, in each of the beads 55, the height dimension of the bead 55 in the Y direction may be larger than the width dimension of the bead 55 in the Z direction. In this configuration, by elongating the bead lateral surfaces 56*b*, 56*c* in the Y direction as much as possible, the contact surface area of the bead lateral surface 56*b*, 56*c* relative to the recess wall surface 63, 64 or the fin lateral surface 73, 74 can be increased.

In each of the above embodiments, the number of the beads 55 in the passage, such as the floor passage 32, may be two or more (i.e., a plurality of beads 55) or may be only one. For example, in the first embodiment, the bead 55 may extend in the upstream passage 32*a* and the downstream passage 32*b* across the curved passage 32*c*. In this configuration, a portion of the bead 55, which is placed at the upstream passage 32*a*, serves as a first connection portion, and a portion of the bead 55, which is placed at the downstream passage 32*b*, serves as a second connection portion. Furthermore, the bead 55 may extend in an intersecting direction that intersects the upstream-to-downstream direction of the floor passage 32.

In each of the above embodiments, the number of the fins 70 arranged in the width direction of the floor passage 32, may be two or more (i.e., a plurality of fins 70) or may be only one. A plurality of fins 70 may be arranged one after another in the upstream-to-downstream direction of the floor passage 32. The fin 70 may be shaped or sized such that the fin distal end surface 72 is spaced from the lower cover 50 toward the recess bottom surface 62. Furthermore, the fin 70 may not be placed between adjacent two of the beads 55 which are adjacent to each other in the width direction of the floor passage 32. In other words, a plurality of beads 55 may be arranged one after another in the width direction of the floor passage 32 between adjacent two of the fins 70, which are adjacent to each other in the width direction of the floor passage 32.

In each of the above embodiments, in the floor passage 32, a flow direction of the refrigerant in the upstream passage (serving as the first passage) 32*a* and a flow direction of the refrigerant in the downstream passage (serving as the second passage) 32*b* may not be opposite to each other. For example, the flow direction of the refrigerant in the upstream passage 32*a* may be the same as the flow direction of the refrigerant in the downstream passage 32*b*. Furthermore, the first passage and the second passage may be arranged parallel to each other with respect to the upstream-to-downstream direction instead of arranging the first passage and the second passage one after the other in the upstream-to-downstream direction. In this case, for example, a portion of the main body floor 41, at which the lower cover 50 is joined through the joint 37, serves as the partition, and portions of the main body floor 41, at which the lower cover 50 is not joined, serves as the fins.

In each of the above embodiments, the first passage and the second passage may not be arranged side by side in the floor passage 32. For example, the floor passage 32 may have a single passage that extends in the X direction. Furthermore, the passage may not be straight like the upstream passage 32*a* or the downstream passage 32*b*, but may be curved.

In each of the above embodiments, the case 20 may be made of, for example, a resin material as long as the case 20 can form a passage which conducts the fluid.

In each of the above embodiments, the passage cover, such as the lower cover 50, may form the floor upper surface 23*a* at the case floor 23 instead of the floor lower surface 23*b*. Specifically, the opening of the recess 60 may face the inside space 21 instead of facing the side which is opposite to the inside space 21. In such a case, in the case main body 40, the upper surface of the main body floor 41 serves as a main body surface.

In each of the above embodiments, the portion of the case 20, at which the passage is formed, may not be the case outer wall 24 as long as this portion of the case 20 defines the inside space 21. For example, the passage may be formed at the case outer wall 24. Furthermore, in a case where the case 20 has a ceiling or a partition as the portion that defines the inside space 21, the passage may be provided to the ceiling or the partition. For example, in the configuration, in which the passage is formed at the case outer wall 24, the passage cover forms the inner wall surface and the outer wall surface of the case outer wall 24.

In each of the above embodiments, the fluid, which flows in the passage formed by the case 20, may exert a heating effect rather than the cooling effect as long as the fluid can exchange heat with the air and/or the electrical components in the case 20. In the configuration, in which the fluid exerts the heating effect, the device, which includes the case 20 may be referred to as a heater rather than the cooler 30. Furthermore, the case 20 and the electric power converter apparatus 10 may have a configuration that is not intended to allow this fluid to exchange the heat with the air and/or the electrical components in the case 20. For example, the thermal conductivity of the case main body 40 and the thermal conductivity of the lower cover 50 may be low.

In each of the above embodiments, the electrical components, which are received in the case 20, may include a transformer, an electric motor, a bus bar and/or a terminal block in addition to the converter unit 15. The electric apparatus, which includes the electrical components, may be, for example: a voltage converter including a transformer; or a motor device including an electric motor besides the electric power converter apparatus 10. The electric power converter apparatus 10 may be, for example: an inverter apparatus; an electric power supply apparatus which converts an AC input into a DC output; an electric power supply apparatus, which converts a DC input into a DC output; or an electric power supply apparatus, which converts an AC input into an AC output besides the converter apparatus.

In each of the above embodiments, the vehicle, which has the electric power converter apparatus 10, may be, for example, a passenger car, a bus, a construction work vehicle or an agricultural machinery vehicle. Furthermore, the vehicle is one of the moving objects. The other moving objects, which have the electric power converter apparatus 10, may include a train and an airplane.

In each of the above embodiments, the electric power converter apparatus 10 and the case 20 are a movable electric apparatus and a movable case, respectively, to be installed to the moving object, such as the vehicle. Alternatively, the electric power converter apparatus 10 and the case 20 may be a stationary electric apparatus and a stationary case, respectively.

What is claimed is:

1. A case that has a passage which is configured to conduct fluid and extends along an inside space of the case, the case comprising:
    a case main body that has a main body surface and defines the inside space, wherein a recess, which forms the passage, is formed at the main body surface; and
    a passage cover that is shaped in a plate form and is assembled to the main body surface to cover the recess, wherein the passage cover cooperates with the recess to form the passage, wherein:
    the passage cover includes:
        a pair of joint plate portions which are joined to the main body surface through a joint, wherein the pair of joint plate portions are arranged one after another in a width direction of the passage while the passage is interposed between the pair of joint plate portions;
        at least one passage plate portion which is placed between the pair of joint plate portions and is opposed to the recess via the passage in a state where the at least one passage plate portion extends in the width direction; and
        a plurality of connection portions, each of which is placed between a corresponding one of the at least one passage plate portion and one of the pair of joint plate portions, wherein each of the plurality of connection portions is joined to the corresponding one of the at least one passage plate portion and extends in an intersecting direction that intersects the at least one passage plate portion;
    an inner surface of the recess includes a plurality of intersecting surfaces each of which extends in the intersecting direction that intersects the at least one passage plate portion; and
    the plurality of connection portions include a contactable connection portion, which extends from the corresponding one of the at least one passage plate portion toward the recess and is placed at a position, at which the contactable connection portion comes in contact with a corresponding one of the plurality of intersecting surfaces;
    the corresponding one of the plurality of intersecting surfaces includes:
        a rising surface which extends in a depth direction of the recess; and
        a sloped surface which is placed between the rising surface and the one of the pair of joint plate portions in the depth direction, wherein a degree of tilt of the sloped surface relative to the depth direction is larger than a degree of tilt of the rising surface relative to the depth direction; and
    the contactable connection portion is placed at the position, at which the contactable connection portion comes in contact with the sloped surface.

2. The case according to claim 1, wherein the contactable connection portion is in contact with the corresponding one of the plurality of intersecting surfaces.

3. The case according to claim 1, wherein:
    the passage cover includes a peripheral wall surface as the corresponding one of the plurality of intersecting surfaces, wherein the peripheral wall surface forms a peripheral edge portion of the passage; and
    the passage cover includes a wall-side connection portion as the contactable connection portion, wherein the wall-side connection portion joins between the corresponding one of the at least one passage plate portion and the one of the pair of joint plate portions and is placed at the position, at which the wall-side connection portion comes in contact with the peripheral wall surface.

4. The case according to claim 1, wherein:
    the plurality of intersecting surfaces include a fin lateral surface as the corresponding one of the plurality of intersecting surfaces, wherein the fin lateral surface is a lateral surface of a fin that extends from the inner surface of the recess toward the passage cover;
    the at least one passage plate portion is a plurality of passage plate portions which are arranged one after another in the width direction between the pair of joint plate portions; and
    the passage cover includes a fin-side connection portion as the contactable connection portion, wherein the fin-side connection portion joins between adjacent two of the plurality of passage plate portions, which are adjacent to each other in the width direction, and the fin-side connection portion is placed at the position, at which the fin-side connection portion comes in contact with the fin lateral surface.

5. The case according to claim 1, wherein each of the plurality of connection portions is curved to bulge in the intersecting direction that intersects the at least one passage plate portion.

6. The case according to claim 1, wherein:
    the passage includes a first passage and a second passage while the second passage extends along the first passage;
    the case main body includes a partition that is placed between the first passage and the second passage and partitions between the first passage and the second passage;
    the passage cover extends over the first passage and the second passage across the partition in a side-by-side direction that is a direction, along which the first passage and the second passage are arranged side by side;
    the passage cover includes a plurality of joint plate portions that include the pair of joint plate portions, wherein the plurality of joint plate portions include:
        a partition joint plate portion which is placed between the first passage and the second passage and is joined to the partition;
        a first joint plate portion which is placed on a side of the first passage that is opposite to the partition joint plate portion; and
        a second joint plate portion which is placed on a side of the second passage that is opposite to the partition joint plate portion;
    the at least one passage plate portion is a plurality of passage plate portions that include:
        a first passage plate portion which is placed between the first joint plate portion and the partition joint plate portion and is opposed to the recess via the first passage in a state where the first passage plate portion extends in the side-by-side direction; and
        a second passage plate portion which is placed between the second joint plate portion and the partition joint plate portion and is opposed to the recess via the second passage in a state where the second passage plate portion extends in the side-by-side direction; and the plurality of connection portions include:
a first connection portion which is placed between the first joint plate portion and the first passage plate portion and is joined to the first passage plate portion while the first connection portion extends in the intersecting direction that intersects the first passage plate portion; and
a second connection portion which is placed between the second joint plate portion and the second passage plate portion and is joined to the second passage plate portion while the second joint plate portion extends in the intersecting direction that intersects the second passage plate portion.

7. The case according to claim 6, wherein:
the recess includes:
a first peripheral wall surface that is placed on a side of the first passage which is opposite to the partition, wherein the first peripheral wall surface forms a peripheral edge portion of the first passage; and
a second peripheral wall surface that is placed on a side of the second passage which is opposite to the partition, wherein the second peripheral wall surface forms a peripheral edge portion of the second passage; and
the first connection portion joins between the first joint plate portion and the first passage plate portion and is placed at a position, at which the first connection portion comes in contact with the first peripheral wall surface; and
the second connection portion joins between the second joint plate portion and the second passage plate portion and is placed at a position, at which the second connection portion comes in contact with the second peripheral wall surface.

8. An electric apparatus comprising:
an electrical component; and
a case that receives the electrical component in an inside space of the case and has a passage which is configured to conduct fluid and extends along the electrical component, wherein:
the case includes:
a case main body that has a main body surface and defines the inside space, wherein a recess, which forms the passage, is formed at the main body surface; and
a passage cover that is shaped in a plate form and is assembled to the main body surface to cover the recess, wherein the passage cover cooperates with the recess to form the passage; and
the passage cover includes:
a pair of joint plate portions which are joined to the main body surface through a joint, wherein the pair of joint plate portions are arranged one after another in a width direction of the passage while the passage is interposed between the pair of joint plate portions;
at least one passage plate portion which is placed between the pair of joint plate portions and is opposed to the recess via the passage in a state where the at least one passage plate portion extends in the width direction; and
a plurality of connection portions, each of which is placed between a corresponding one of the at least one passage plate portion and one of the pair of joint plate portions, wherein each of the plurality of connection portions is joined to the corresponding one of the at least one passage plate portion and extends in an intersecting direction that intersects the at least one passage plate portion;
an inner surface of the recess includes a plurality of intersecting surfaces each of which extends in the intersecting direction that intersects the at least one passage plate portion; and
the plurality of connection portions include a contactable connection portion, which extends from the corresponding one of the at least one passage plate portion toward the recess and is placed at a position, at which the contactable connection portion comes in contact with a corresponding one of the plurality of intersecting surfaces;
the corresponding one of the plurality of intersecting surfaces includes:
a rising surface which extends in a depth direction of the recess; and
a sloped surface which is placed between the rising surface and the one of the pair of joint plate portions in the depth direction, wherein a degree of tilt of the sloped surface relative to the depth direction is larger than a degree of tilt of the rising surface relative to the depth direction; and
the contactable connection portion is placed at the position, at which the contactable connection portion comes in contact with the sloped surface.

* * * * *